(12) United States Patent
Tsukada et al.

(10) Patent No.: US 8,389,969 B2
(45) Date of Patent: Mar. 5, 2013

(54) SEMICONDUCTOR MEMORY USING IGBT, INSULATED GATE BIPOLAR TRANSISTOR, AS SELECTIVE ELEMENT

(75) Inventors: Shuichi Tsukada, Tokyo (JP); Yasuhiro Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 142 days.

(21) Appl. No.: 13/029,751

(22) Filed: Feb. 17, 2011

(65) Prior Publication Data

US 2011/0210302 A1    Sep. 1, 2011

(30) Foreign Application Priority Data

Feb. 26, 2010   (JP) .................................. 2010-042817

(51) Int. Cl.
*H01L 47/00*    (2006.01)

(52) U.S. Cl. .................................... 257/2; 257/E27.074

(58) Field of Classification Search .................. 257/2–5, 257/390, 262, 265, 288, 300, 303, 330, 331, 257/332, E27.098, E27.074, E29.3, E29.309, 257/E21.613, E21.645, E21.662

See application file for complete search history.

(56) References Cited

U.S. PATENT DOCUMENTS 6,576,921 B2   6/2003  Lowrey

*Primary Examiner* — Victor A Mandala
*Assistant Examiner* — Selim Ahmed
(74) *Attorney, Agent, or Firm* — Morrison & Foerster LLP

(57) ABSTRACT

A semiconductor device includes a semiconductor substrate of a first conductivity type, a first insulating film region that is embedded in a trench formed on the semiconductor substrate, a gate electrode that covers a lower surface of the first insulating film region, and a gate insulating film that is provided between the gate electrode and the semiconductor substrate. The semiconductor device further includes a first diffusion region that covers a first side surface of the first insulating film region, a second diffusion region that covers a second side surface of the first insulating film region, and a third diffusion region that covers an upper surface of the second diffusion region. A selective element includes a field-effect transistor that is constituted by the gate electrode, the first diffusion region, and the second diffusion region, and a bipolar transistor that is constituted by the substrate and the second and third diffusion regions.

22 Claims, 14 Drawing Sheets

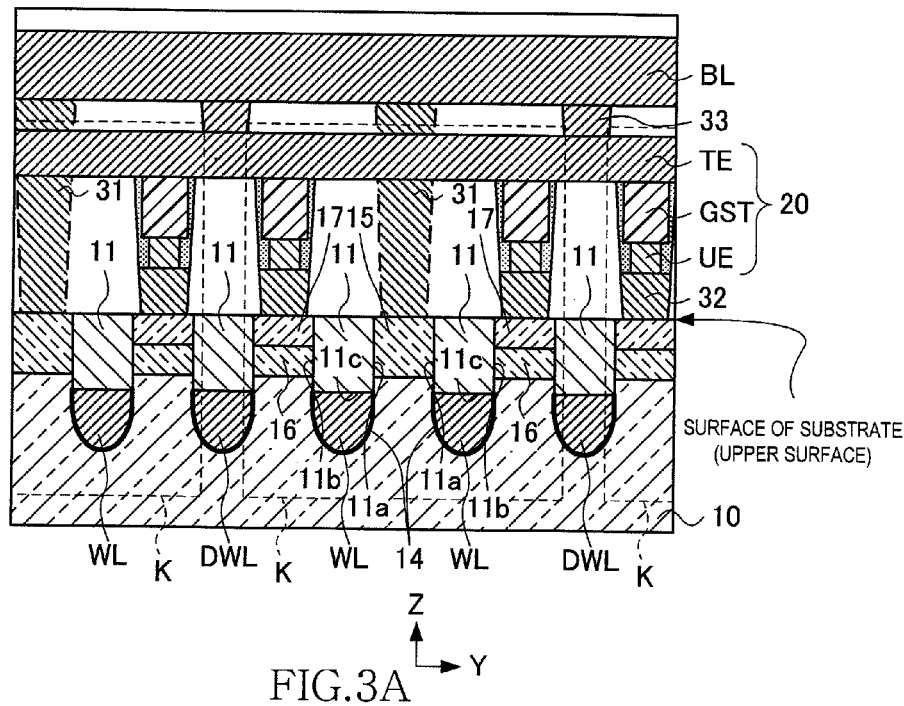
FIG.3A
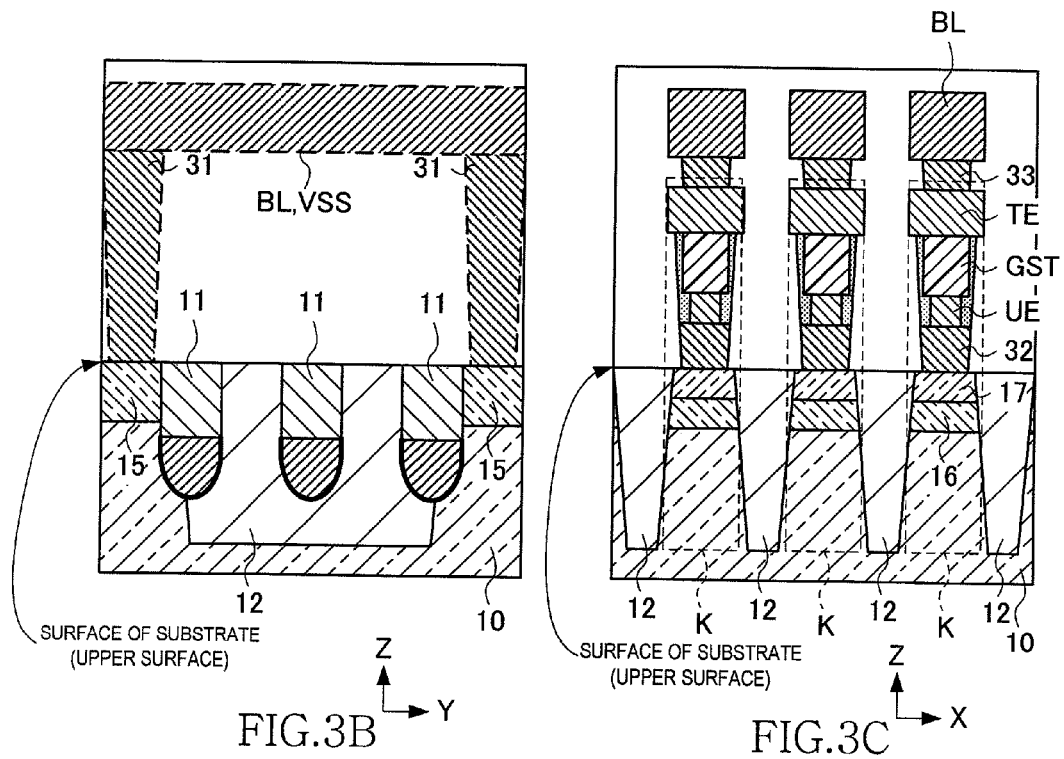
FIG.3B
FIG.3C

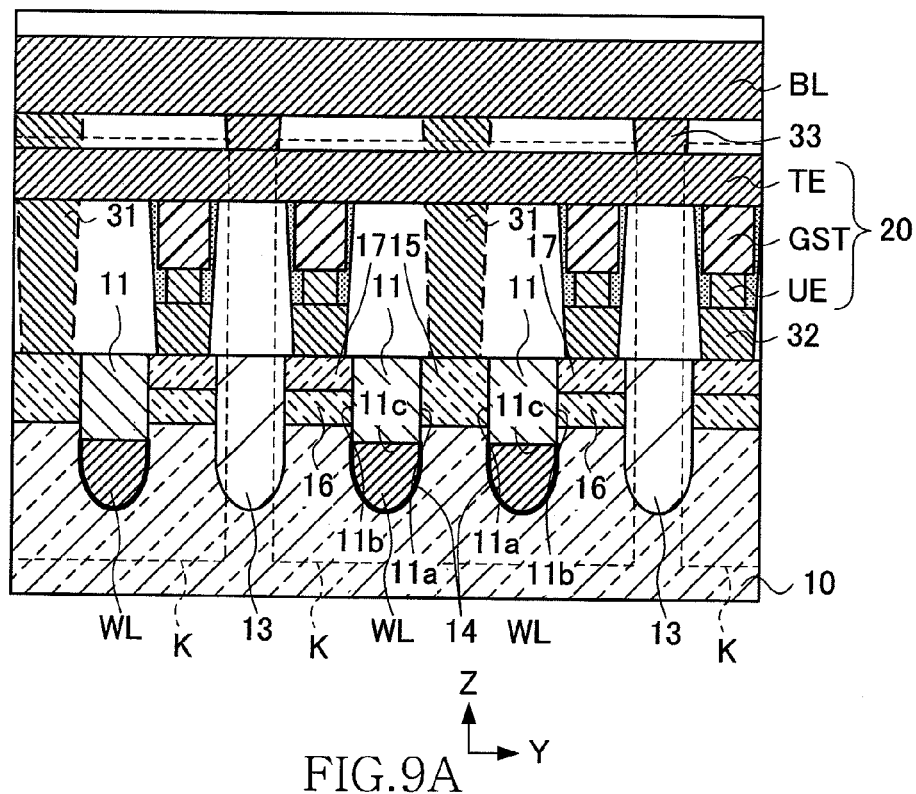
FIG.9A
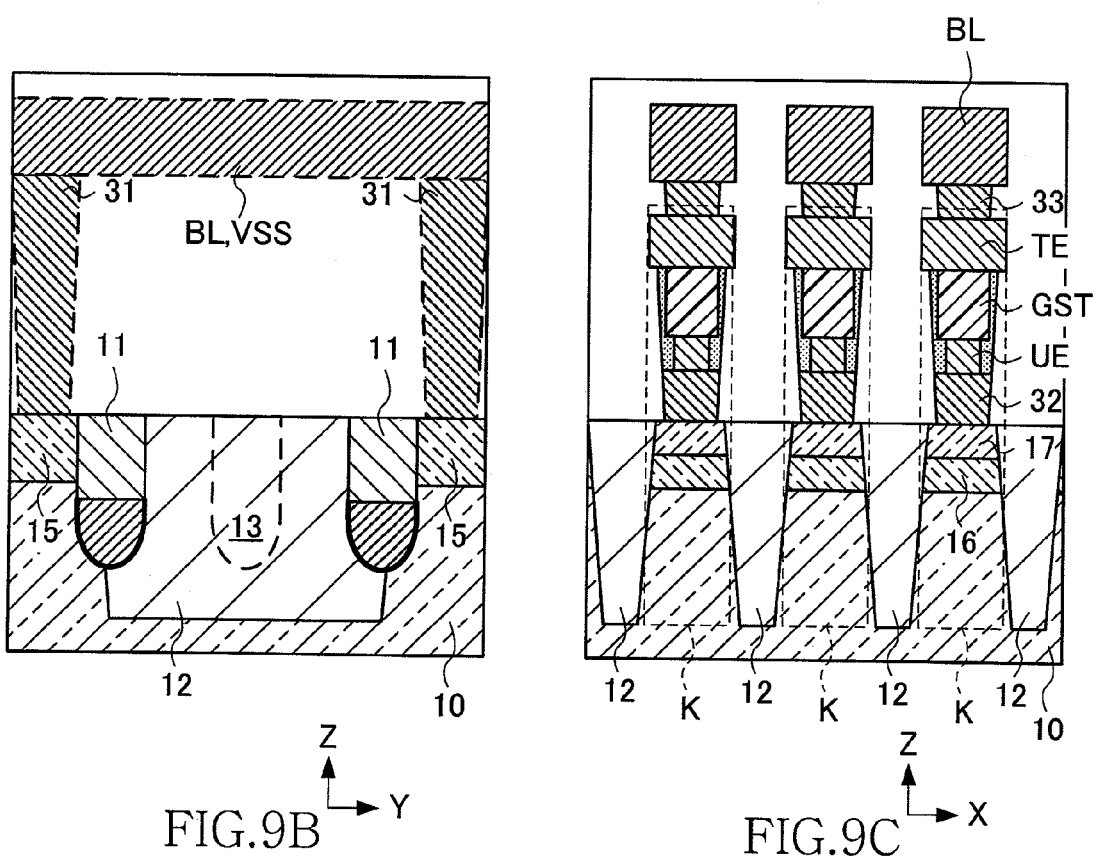
FIG.9B
FIG.9C

SEMICONDUCTOR MEMORY USING IGBT, INSULATED GATE BIPOLAR TRANSISTOR, AS SELECTIVE ELEMENT

BACKGROUND OF THE INVENTION

1. Field of the Invention

The present invention relates to a semiconductor device, and more particularity relates to a semiconductor device using an IGBT (Insulated Gate Bipolar Transistor) as a selective element.

2. Description of Related Art

In recent years, a semiconductor device including a semiconductor memory device such as a DRAM (Dynamic Random Access Memory) and a PC-RAM (Phase Change Random Access Memory) has an increasingly smaller area that can be allocated to a selective element (such as a cell transistor of a DRAM) along with the progress of downscaling. As the allocated area becomes smaller, the value of a current flowing to a selective element (such as a drain current of a field-effect transistor and a write current Icell in a DRAM) becomes small. Therefore, to secure a certain level of the current value, constituting a selective element by a combination of a MOS (Metal Oxide Semiconductor) transistor and a bipolar transistor has been examined.

U.S. Pat. No. 6,576,921 discloses an example of a cell transistor of a phase-change memory that uses such a selective element. In this conventional example, word lines are formed on a surface of a P-type substrate via a gate insulating film, and first and second N-type diffusion regions are formed in a region within a substrate surface close to both sides of the word lines. In the second N-type diffusion region, a P-type diffusion region is further provided in a region within a substrate surface far from a gate electrode. With this arrangement, a MOS transistor is formed by the P-type substrate, the first and second N-type diffusion regions, the gate insulating film, and the gate electrode, and a bipolar transistor is formed by the P-type substrate, the second N-type diffusion region, and the P-type diffusion region. The second N-type diffusion region functions as both a drain of the MOS transistor and a base of the bipolar transistor.

The P-type substrate and the first N-type diffusion region are grounded. Meanwhile, the P-type diffusion region is connected to bit lines via a phase-change memory element. When a voltage that exceeds a threshold value of the MOS transistor is applied to word lines in this state, the MOS transistor is turned on, and a drain current flows. This drain current flows to the second N-type diffusion region, and turns on the bipolar transistor. Because the phase-change memory element is connected to the ground, writing and reading can be performed to the phase-change memory element by controlling a voltage applied to the bit lines.

However, the selective element described in U.S. Pat. No. 6,576,921 has a problem that the length in a lateral direction becomes large. That is, according to the configuration of the selective element described above, the first N-type diffusion region, the word lines, the second N-type diffusion region, and the P-type diffusion region are arranged in a bit line direction. Therefore, even when these regions and the word lines are formed in a minimum feature size F, respectively, the length of 4F in the bit line direction becomes necessary. Consequently, a configuration capable of reducing the length of a selective element in a bit line direction has been demanded.

SUMMARY

In one embodiment, there is provided a semiconductor device comprising: a semiconductor substrate of a first conductivity type; a gate insulating film that is formed on a bottom surface of a trench formed on the semiconductor substrate and on a part of an internal wall of the trench; a gate electrode that is embedded in the trench so as to cover the gate insulating film; a cap insulating film region that is embedded in the trench so as to cover the gate electrode; first and second diffusion regions that are formed on a first side surface (a first lateral) of the cap insulating film region and on a second side surface (a second lateral) opposite to the first side surface, respectively, and constitute a field-effect transistor together with the gate electrode and; and a third diffusion region that is formed between the second side surface of the cap insulating film region, an upper surface of the semiconductor substrate, and an upper surface of the second diffusion region and constitutes a bipolar transistor together with the substrate and the second diffusion region, wherein the field-effect transistor and the bipolar transistor constitute a first selective element, the first and second diffusion regions are diffusion regions of a second conductivity type, and the third diffusion region is a diffusion region of the first conductivity type.

In another embodiment, there is provided a semiconductor device comprising: a semiconductor substrate of a first conductivity type; a cap insulating film region that is embedded in the semiconductor substrate and has a first side surface (a first lateral) perpendicular to an upper surface of the semiconductor substrate, a second side surface (a second lateral) opposite to the first side surface, and a lower surface opposite to the upper surface of the semiconductor substrate; a gate electrode of which whole of a body thereof is embedded in the semiconductor substrate and that covers a lower surface of the cap insulating film region; a gate insulating film of which whole of a body thereof is embedded in the semiconductor substrate and that is formed between the gate electrode and the semiconductor substrate; a first diffusion region that covers the first side surface of the cap insulating film region; a second diffusion region that covers the second side surface of the cap insulating film region; and a first selective element that covers the second side surface of the cap insulating film region and an upper surface of the second diffusion region, and has a third diffusion region in contact with the upper surface of the semiconductor substrate, wherein the gate electrode and the first and second diffusion regions constitute a field-effect transistor, the substrate and the second and third diffusion regions constitute a bipolar transistor, the field-effect transistor and the bipolar transistor constitute a first selective element, the first and second diffusion regions are diffusion regions of a second conductivity type, and the third diffusion region is a diffusion region of the first conductivity type.

In still another embodiment, there is provided a semiconductor device comprising: a semiconductor device of a first conductivity type; a gate insulating film that is formed on a bottom surface of trenches formed on the semiconductor substrate and extended in a first direction and on a part of an internal wall of these trenches; a gate electrode that is embedded in the trenches so as to cover the gate insulating film and is a word line extended in the first direction; a cap insulating film region that is embedded in the trenches so as to cover the gate electrode and is extended in the first direction; a first diffusion region of a second conductivity type and a second diffusion region of a second conductivity type that are formed respectively on a part of a first second-directional side surface of the cap insulating film region and on a part of a second second-directional side surface opposite to a part of the first second-directional side surface and constitute a field-effect transistor together with the corresponding gate electrode, the second direction being orthogonal to the first direction; a third diffusion region of the first conductivity type that is formed between a part of the second second-directional side surface of the cap insulating film region, an upper surface of the semiconductor substrate, and an upper surface of the second diffusion region, and constitutes a bipolar transistor together with the substrate and the corresponding second diffusion region; a plurality of bit lines extended in the second direction; an active region that is partitioned in at least a part of a region below the bit lines by a first element isolation region (a first isolation region of elements) formed between the bit lines; and a plurality of memory elements that correspond respectively to one of intersections of the bit lines and the word lines, and are connected to the corresponding third diffusion region included in the active region, wherein a plurality of the field-effect transistors and a plurality of the bipolar transistors that respectively correspond to the field-effect transistors, each included in the active region, constitute a plurality of selective elements, and the memory elements and the selective elements that respectively correspond to the memory elements constitute a plurality of memory cells.

According to the present invention, a field-effect transistor is formed by a semiconductor substrate, first and second diffusion regions, gate insulating films, and gate electrodes. A bipolar transistor is formed by a semiconductor substrate and the second and third diffusion regions. The second diffusion region functions as both a controlled electrode of one of field-effect transistors and as a base of a bipolar transistor. Because the second and third diffusion regions are arranged in a normal direction of the semiconductor substrate, 3F is sufficient for the length of the selective element in an arranging direction (the bit line direction) of the first diffusion region, the gate electrode, and the second diffusion region (the third diffusion region). Therefore, the length of the selective element in the bit line direction can be reduced.

BRIEF DESCRIPTION OF THE DRAWINGS

The above features and advantages of the present invention will be more apparent from the following description of certain preferred embodiments taken in conjunction with the accompanying drawings, in which:

FIGS. 3A to 3C are cross-sectional views of the semiconductor device corresponding to a cross section along a line A-A', a cross section along a line B-B', and a cross section along a line C-C' shown in FIGS. 1 and 2, respectively;

FIGS. 9A to 9C are cross-sectional views of the semiconductor device corresponding to a cross section along a line A-A', a cross section along a line B-B', and a cross section along a line C-C' shown in FIG. 8, respectively;

DETAILED DESCRIPTION OF THE EMBODIMENTS

Figure 4:
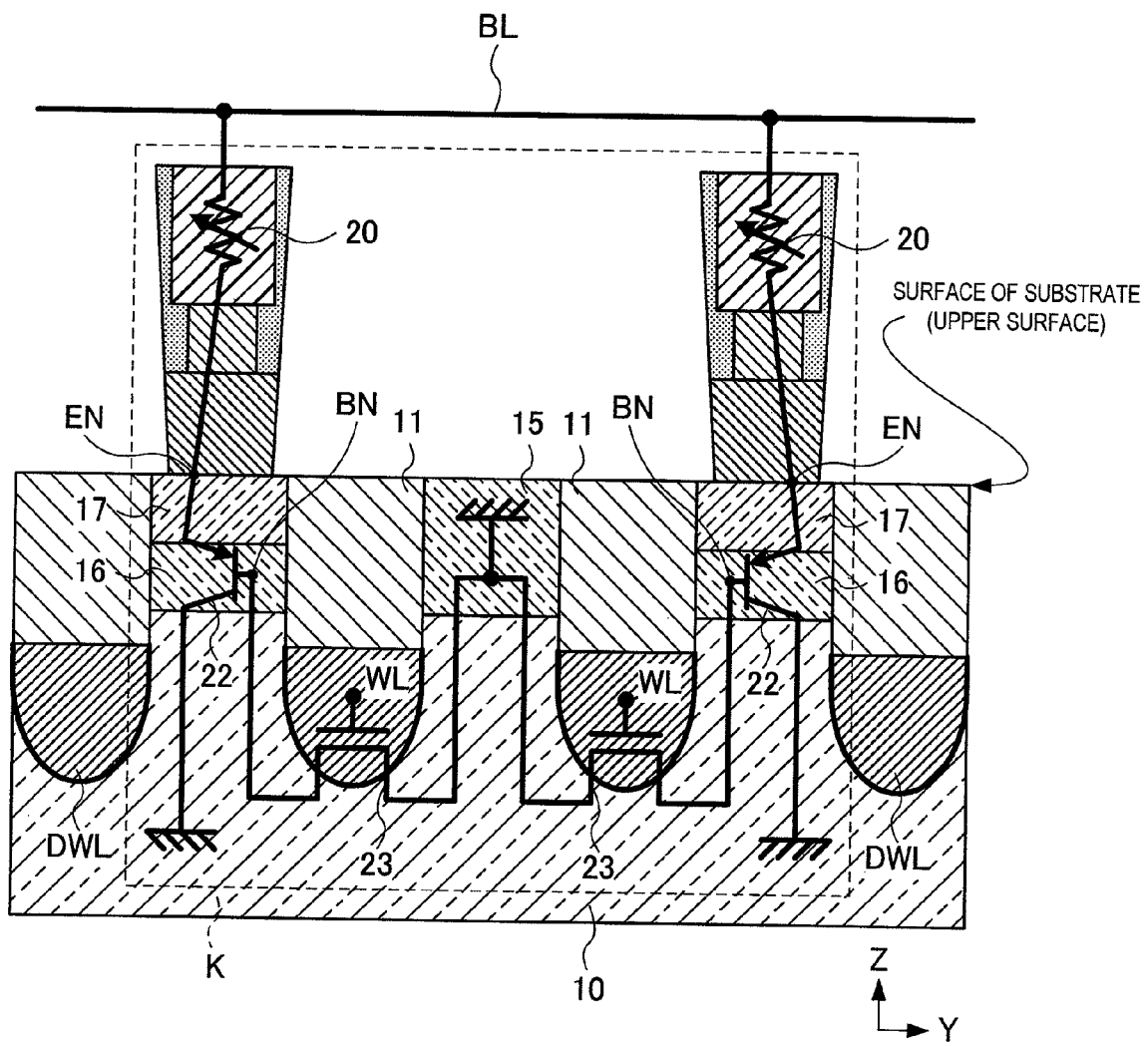
FIG. 4 is an explanatory diagram of a relationship between a configuration of the semiconductor device shown in FIG. 3 and circuit elements of the semiconductor device shown in FIG. 5.

A representative example of a technical concept for solving the problem of the present invention is described below. It is needless to mention that the contents that the present application is to claim for patent are not limited to the following technical concept, but are as described in the appended claims. That is, as shown in FIG. 4, a semiconductor device according to the present invention includes: embedded word lines WL (gate electrodes) each of which having a so-called gap insulating film 11 formed on a semiconductor substrate (of a first conductivity type); first and second diffusion regions 15 and 16 (both are of a second conductivity type) that are formed at both sides of a cap insulating film region and constitute a field-effect transistor together with a gate electrode; and third diffusion regions 17 (of the first conductivity type) each of which is formed between one side surface of the cap insulating film region, an upper surface of the semiconductor substrate, and an upper surface of the second diffusion region, and constitutes a bipolar transistor together with the substrate and the second diffusion region. The field-effect transistor and the bipolar transistor constitute a first selective element. Memory elements 20 are respectively connected to each of the third diffusion regions. The second diffusion region works as one of controlled electrodes of a field-effect transistor and as a base electrode of a bipolar transistor.

Based on this configuration, the field-effect transistor is formed by the semiconductor substrate, the first and second diffusion regions, a gate insulating film, and a gate electrode, and a bipolar transistor is formed by the semiconductor substrate and the second and third diffusion regions. The second diffusion region works as one of controlled electrodes of the field-effect transistor and as a base electrode of the bipolar transistor. Because the second and third diffusion regions are arranged in a normal direction of the semiconductor substrate, 3F is sufficient for the length of a selective element in an arranging direction (bit line direction) of the first diffusion region, the gate electrode, and the second diffusion region (third diffusion region). Therefore, the length of the selective element in the bit line direction can be reduced.

Figure 1:
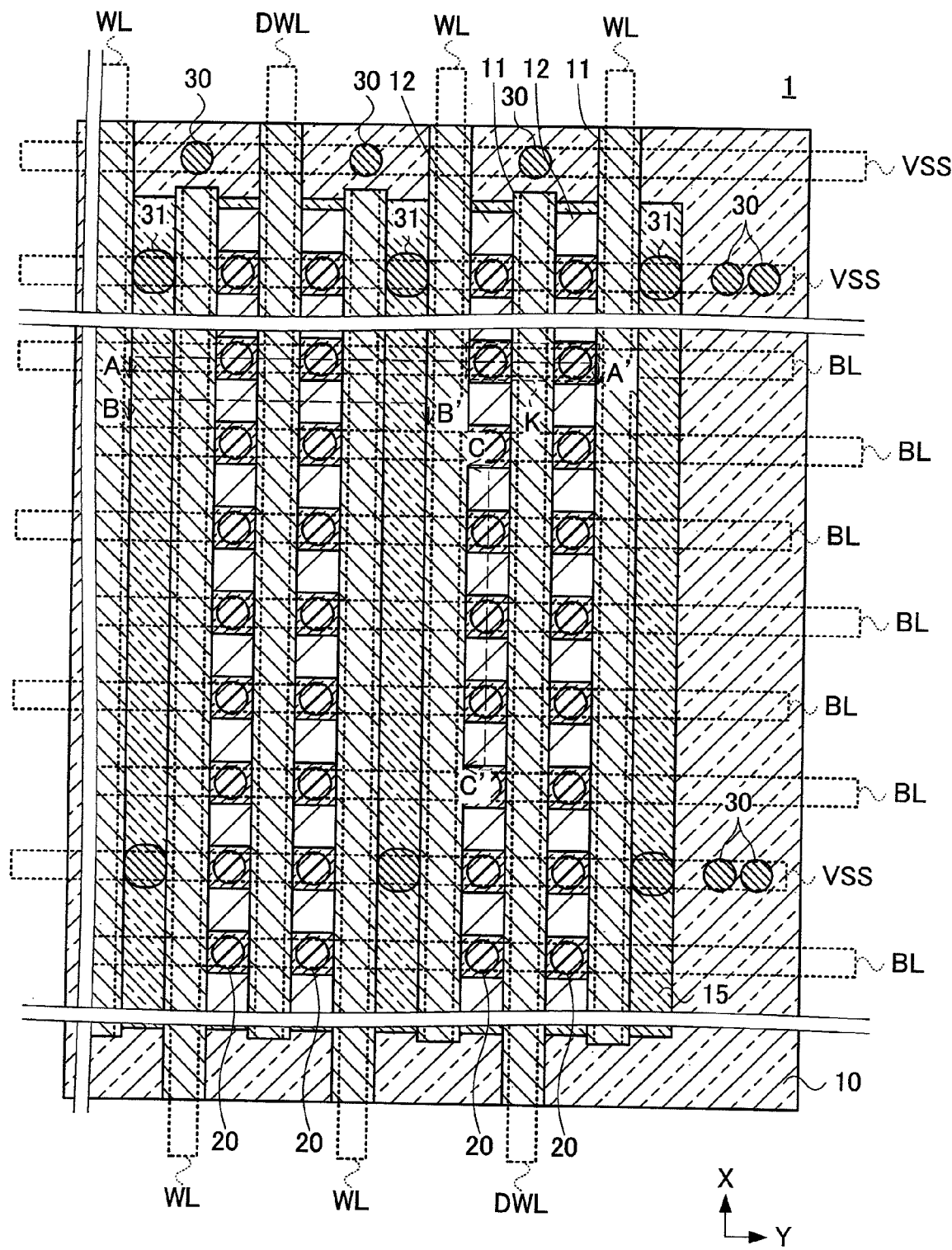
FIGS. 1 and 2 are plan views of a semiconductor device according to a first embodiment of the present invention.

As shown in FIGS. 1 and 4, another example of a semiconductor device according to the technical concept for solving a problem of the present invention includes: a gate insulating film 14 (represented by a thick solid line) that is formed on a bottom surface of trenches which are formed on a semiconductor substrate (of P-type) and are extended in an X direction and on a part of an internal wall of these trenches; the gate electrodes 23 as the word lines WL that are embedded in the trenches so as to cover the gate insulating film and are extended in the X direction; the cap insulating film regions 11 of which trenches are embedded so as to cover the gate electrodes and that are extended in the X direction; the first diffusion regions 15 (of N-type) and the second diffusion regions 16 (of N-type) that are formed respectively on a part of a first Y directional side surface (the Y direction is orthogonal to the X direction) of the cap insulating film regions and on a part of a second side surface opposite to the part of the side surface and constitute a field-effect transistor together with a corresponding gate electrode; the third diffusion regions 17 (of P-type) each of which is formed between a part of the second Y directional side surface of the cap insulating film region, an upper surface of the semiconductor substrate, and an upper surface of the second diffusion region, and constitutes a bipolar transistor together with the substrate and a corresponding second diffusion region; plural bit lines BL extended respectively in the Y direction; an active region K that is partitioned in at least a part of a lower region of the bit lines by an element isolation region 12 (an isolation region 12 of elements) formed between the bit lines; and plural memory elements 20 that correspond respectively to one of intersections of bit lines and word lines and are connected to the corresponding third diffusion region included in the active region. Plural selective elements are constituted by plural field-effect transistors and plural bipolar transistors respectively corresponding to the plural field-effect transistors included respectively in the active region K, and plural memory cells are constituted by plural memory elements and plural selective elements respectively corresponding to the plural memory elements.

The length of the selective element in the bit line direction can be also reduced by the above configuration. Because a region between word lines is embedded with a semiconductor of a first conductivity type instead of a dielectric, capacitance coupling between the word lines is reduced, and coupling noise generated by the capacitance coupling is reduced.

Preferred embodiments of the present invention will be explained below in detail with reference to the accompanying drawings.

Figure 2:
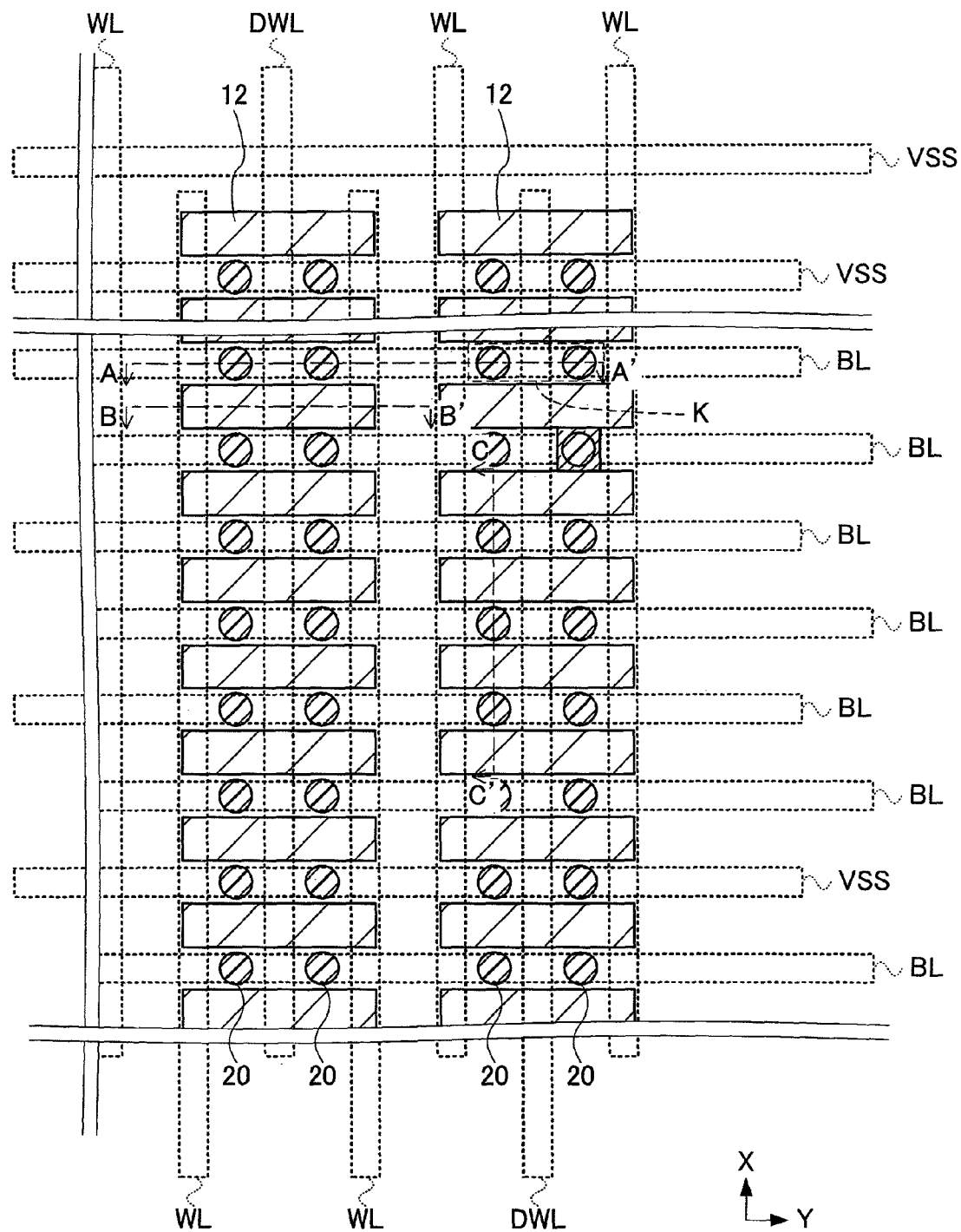

FIG. 1 is a plan view of a semiconductor device 1 according to a first embodiment of the present invention. To facilitate understanding of a configuration of the semiconductor device 1, FIG. 1 shows various constituent elements in a transparent manner and omits various other constituent elements. FIG. 2 is also a plan view of the semiconductor device 1 according to the first embodiment. FIG. 2 facilitates a configuration of an element isolation region described later, and substantially omits constituent elements other than the element isolation region. FIGS. 3A to 3C are cross-sectional views of the semiconductor device 1 corresponding to a cross section along a line A-A', a cross section along a line B-B', and a cross section along a line C-C' shown in FIGS. 1 and 2, respectively.

The semiconductor device 1 is a PC-RAM having the memory elements 20 each including phase-change memory elements, and is provided on a surface of a P-type (first conductivity type) semiconductor (silicon) substrate 10 as shown in FIG. 1 and others. In the present invention, the P-type semiconductor substrate 10 includes a P-type diffusion region (Pwell) provided on a silicon substrate surface. FIGS. 1 and 2 show portions near a corner of a memory mat of a PC-RAM.

A circuit configuration of the semiconductor device 1 is explained first.

Figure 5:
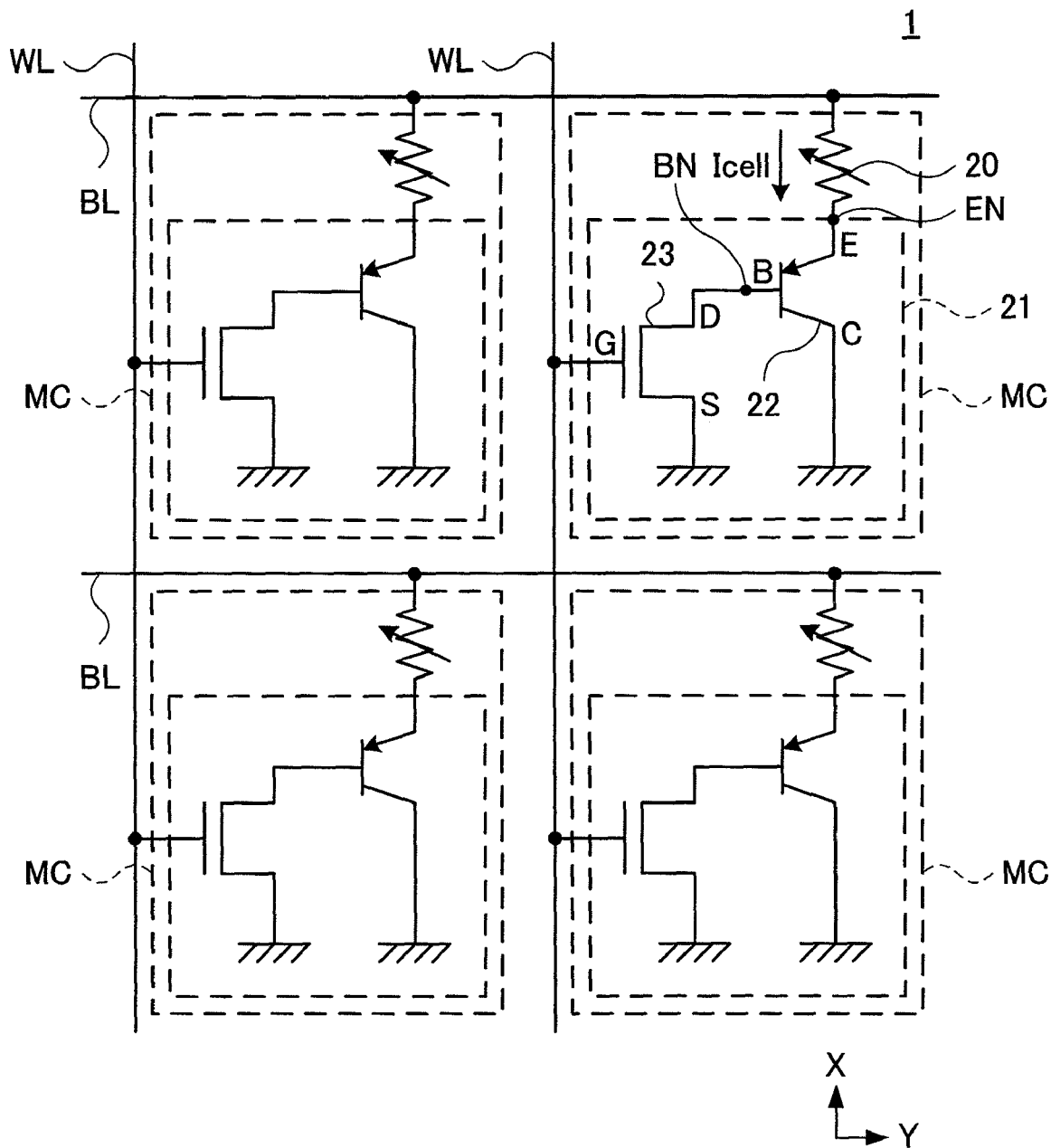
FIG. 5 is an equivalent circuit diagram of the semiconductor device according to a first embodiment of the present invention.

FIG. 5 is an equivalent circuit diagram of the semiconductor device 1. FIG. 5 shows only four memory cells. As shown in FIG. 5, the semiconductor device 1 includes plural word lines WL arranged in the X direction, the plural bit lines BL arranged in the Y direction, and plural memory cells MC arranged at intersections of the word lines WL and the bit lines BL.

As shown in FIG. 5, each of the memory cells MC has the memory element 20 and a selective element 21 (first selective element). The memory element 20 is configured to include a phase change material. The phase change material is not particularly limited when the material has two or more phase states and also when an electric resistance is different depending on a phase state. A so-called calcogenide material is preferably selected. The calcogenide material can selectively take a phase state of a relatively high-resistance amorphous phase or a relatively low-resistance crystalline phase, and is an alloy containing at least one of germanium (Ge), antimony (Sb), tellurium (Te), indium (In), and selenium (Se). For example, there are binary alloys such as GaSb, InSb, InSe, $Sb_2Te_3$, and GeTe, ternary alloys such as $Ge_2Sb_2Te_5$, InSbTe, GaSeTe, $SnSb_2Te_4$, and InSbGe, and quaternary alloys such as AgInSbTe, (GeSn)SbTe, GeSb(SeTe), and $Te_{81}Ge_{15}Sb_2S_2$.

One end of each of the memory elements 20 is connected to the bit line BL, and the other end is connected to the selective element 21.

The selective element 21 has a PNP-type bipolar transistor 22 and an N-channel MOS transistor 23, thereby constituting a so-called IGBT (Insulated Gate Bipolar Transistor). Detailed configurations and constituent materials of the selective element 21 are described later.

An emitter E of each bipolar transistor 22 is connected to the memory element 20, and a collector C of the transistor is connected to a ground wiring. A base B of the bipolar transistor 22 is connected to a drain D (one controlled electrode) of the MOS transistor 23. A gate G (control electrode) of the MOS transistor 23 is connected to the word line WL, and a source S (the other controlled electrode) of the transistor is connected to a ground wiring (the semiconductor substrate 10). In the following explanations, a connection point between the bipolar transistor 22 and the memory element 20 is called an emitter node EN, and a connection point between the bipolar transistor 22 and the MOS transistor 23 is called a base node BN.

When the memory cell MC is selected, the word line WL connected to the gate electrode G of the memory cell MC to be selected is activated (set at a high electric potential). A drain current flows to the MOS transistor 23, the bipolar transistor 22 is turned on, and the emitter node EN is connected to the ground wiring. Accordingly, the memory element 20 is connected between the bit line BL and the ground wiring. Therefore, it becomes possible to control a phase state of the memory element 20 (write) by controlling an amount of a current to be passed to the bit line BL, and to detect a phase state of the memory element 20 (read) by detecting an amount of a current flowing through the bit line BL by a sense amplifier (not shown).

Because the IGBT is used for the selective element 21 in this way, a current value of the current Icell that flows to the memory element 20 can be increased as compared with a current value when only a MOS transistor is used for the selective element 21. That is, the current Icell becomes a current which is obtained by amplifying a drain current of the MOS transistor 23 by the bipolar transistor 22. Therefore, the current value of the current Icell becomes larger than the current value of the drain current of the MOS transistor 23.

A change of a voltage in each line and at each node when writing or reading to or from the memory cell MC is explained next.

Figure 6A:
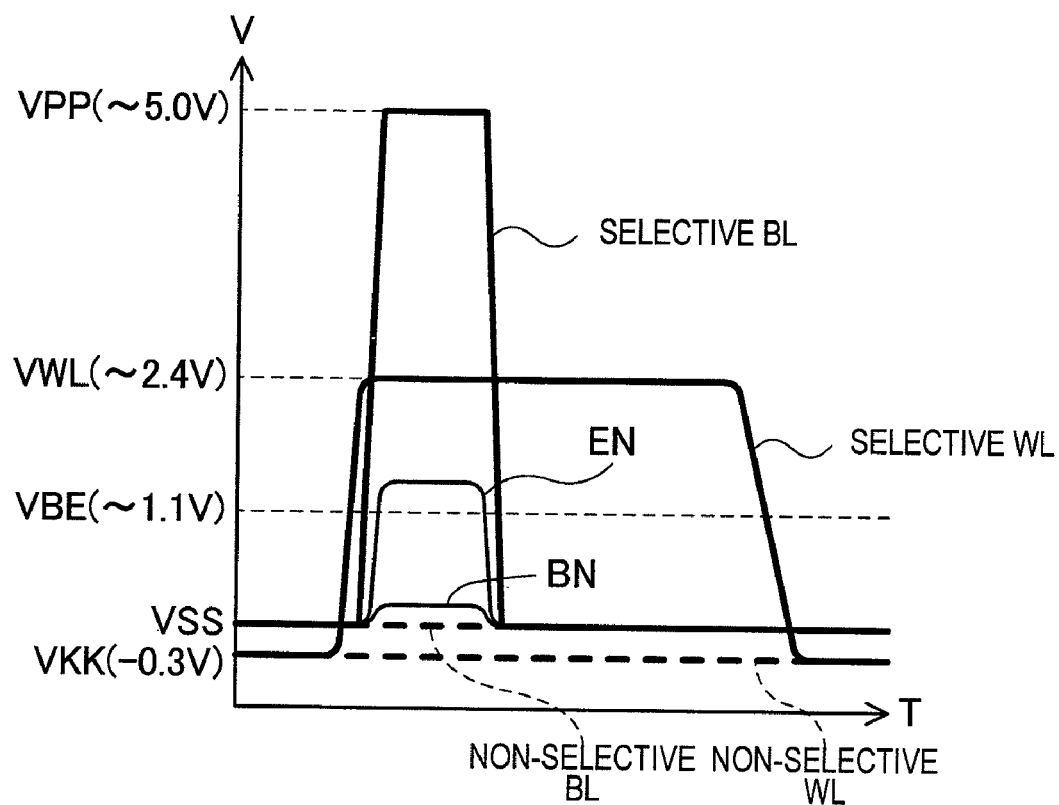
FIG. 6A shows temporal changes of an electric potential in lines and at nodes in case of phase-changing the memory element of the memory cell to be selected to an amorphous phase (Reset)
Figure 6B:
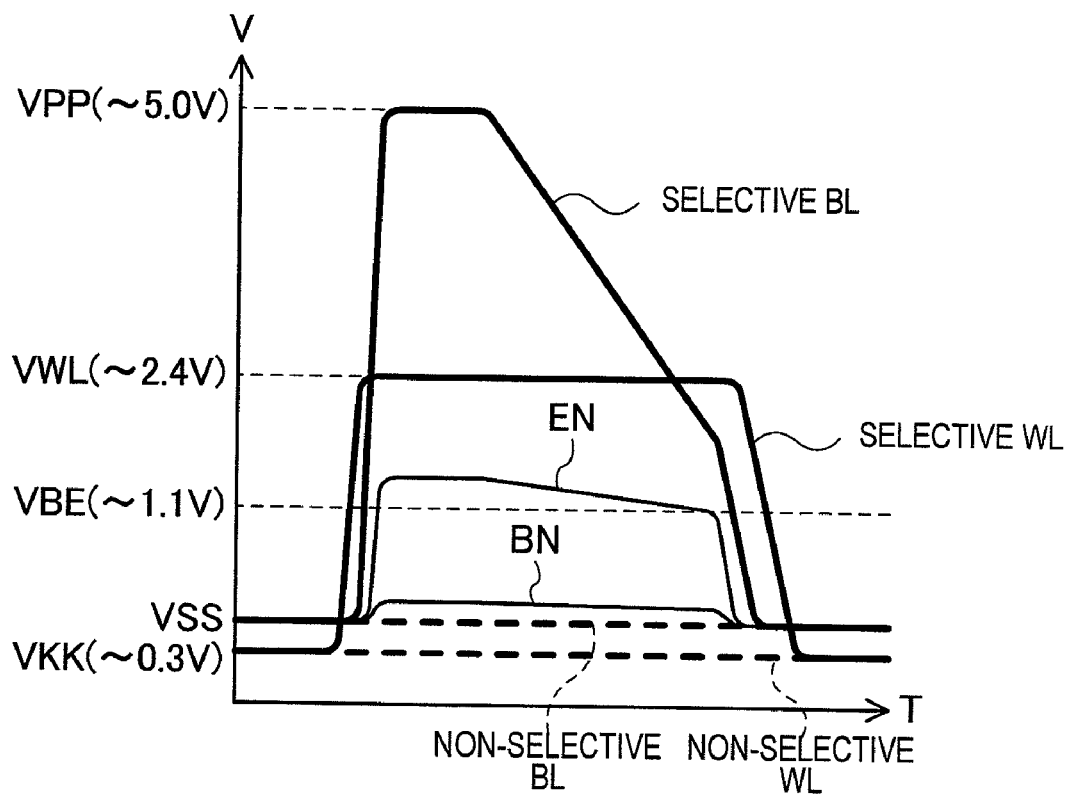
FIG. 6B shows temporal changes of an electric potential in lines and at nodes in case of phase-changing the memory element of the memory cell to be selected to a crystalline phase (Set)
Figure 7A:
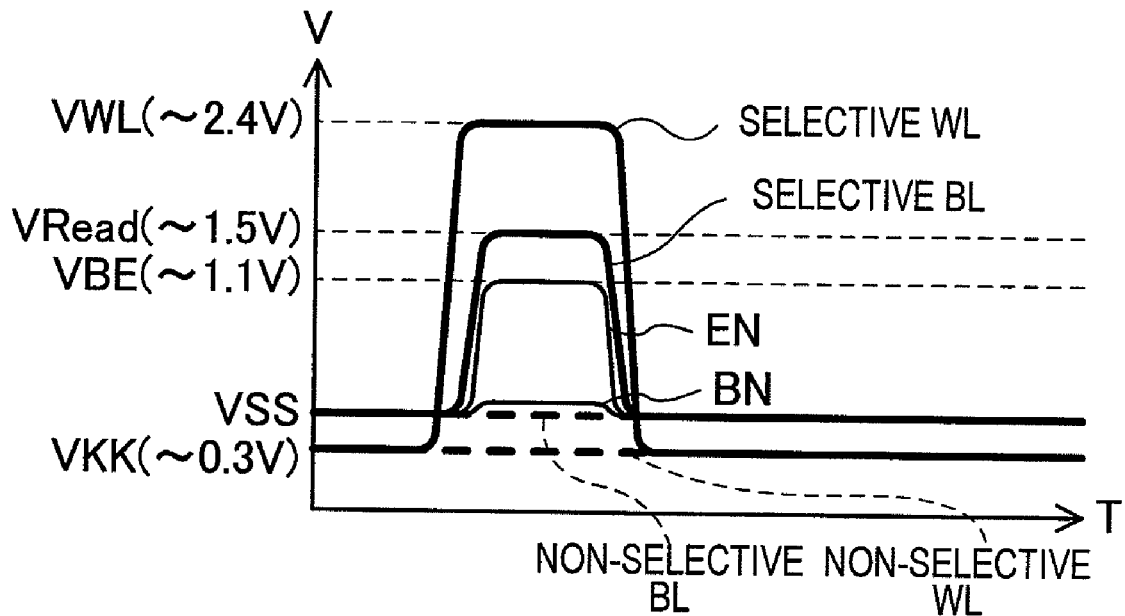
FIG. 7A shows temporal changes of an electric potential in lines and at nodes in case of reading memory information from the memory element that takes an amorphous phase.
Figure 7B:
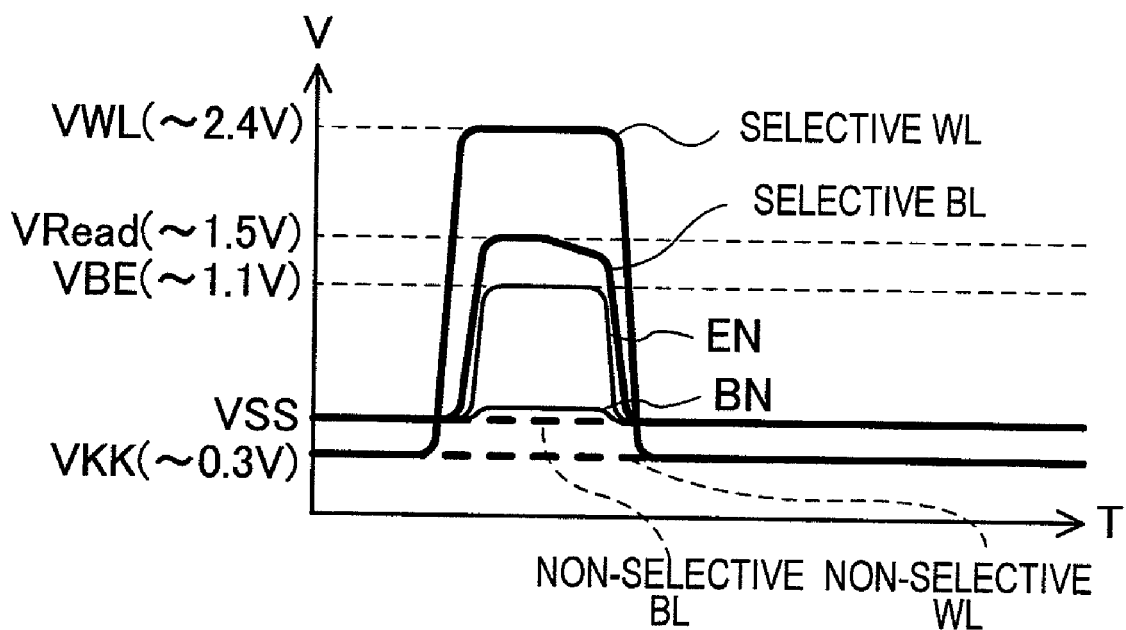
FIG. 7B shows temporal changes of an electric potential in lines and at nodes in case of reading memory information from the memory element that takes a crystalline phase.

FIGS. 6A and 6B and 7A and 7B show temporal changes of an electric potential in lines and at nodes. FIG. 6A shows a case of phase-changing the memory element 20 of the memory cell MC to be selected to an amorphous phase (Reset), and FIG. 6B shows a case of phase-changing the memory element 20 to a crystalline phase (Set). FIG. 7A shows a case of reading memory information from the memory element 20 that takes an amorphous phase, and FIG. 7B shows a case of reading memory information from the memory element 20 that takes a crystalline phase. In these drawings and the following explanations, "selective WL" and "selective BL" represent the word line WL and the bit line BL that are connected to the memory cell MC to be selected, respectively. "Non-selective WL" and "non-selective BL" respectively represent the word line WL and the bit line BL, which are not "selective WL" and not "selective BL". "EN" and "BN" shown in these drawings denote the emitter node EN and the base node BN of the memory cell MC to be selected, respectively.

The following Table 1 is a list of electric potentials of lines and nodes. In Table 1 and in the following explanations, "selective cell" represents the memory cell MC to be selected, "non-selective cell B" represents the memory cell MC that shares the bit line BL with "selective cell", and "non-selective cell W" represents the memory cell MC that shares a word line with "selective cell", respectively.

selective BL is increased to VPP (about 5.0 V), and thereafter is returned to VSS at a high speed, as shown in FIG. 6A. Accordingly, the memory element 20 instantly changes from a state of passing the current Icell to a state of not passing the current Icell. Because the memory element 20 is rapidly cooled by the instant change of the current Icell, its phase state changes to an amorphous phase.

Meanwhile, in phase-changing the memory element 20 of the selective cell to a crystalline phase, an electric potential of the selective BL is increased to VPP, and thereafter is gradually returned to VSS by taking a long time, as shown in FIG. 6B. Because the memory element 20 is cooled by taking a long time after being heated, a phase state of the memory element 20 changes to a crystalline phase.

An electric potential of the emitter node EN of the selective cell at the write time becomes $1.1\ V+\alpha$ ($\alpha$=about 0.2 V) as shown in Table 1. $\alpha$ is an electric potential that is generated in the base node BN when the current Icell flows. An electric potential of the collector of the selective cell becomes $+\beta$ as shown in Table 1. $\beta$ is also an electric potential that is generated when the current Icell flows, and its value is permitted up to about 1.0 V.

Regarding the non-selective cell B at the write time, electric potentials are the same as those at the standby time, except that an electric potential of the emitter node EN becomes the same VPP as the electric potential of the bit line and that an electric potential of the base node BN becomes about 4 V, as shown in Table 1. On the other hand, regarding the non-selective cell W at the write time, electric potentials of the emitter node EN, the base node BN, and the collector all

TABLE 1

| | At standby Whole cells | Write time | | | Read time | | |
|---|---|---|---|---|---|---|---|
| | | Non-selective cell B | Selective cell | Non-selective cell W | Non-selective cell B | Selective cell | Non-selective cell W |
| WL | −0.3 V (VKK) | −0.3 V (VKK) | 2.4 V (VWL) | | −0.3 V (VKK) | 2.4 V (VWL) | |
| BL | 0.0 V (VSS) | About 5.0 V (VPP) | | 0.0 V (VSS) | About 1.5 V (VRead) | | 0.0 V (VSS) |
| Emitter node | 0.0 V (VSS) | About 5.0 V (VPP) | $1.1\ V + \alpha$ | 0.0 V (VSS) | About 1.5 V | About 1.1 V | 0.0 V (VSS) |
| Base node | Floating | About 4 V (Floating) | $+\alpha$ | 0.0 V (VSS) | About 0.5 V (Floating) | About 0 V | 0.0 V (VSS) |
| Collector or Source | 0.0 V (VSS) | 0.0 V (VSS) | $+\beta$ | 0.0 V (VSS) 0.0 V (VSS) | 0.0 V (VSS) | About 0 V | 0.0 V (VSS) |

As shown in FIGS. 6A and 6B and 7A and 7B, and in Table 1, in a standby state, electric potentials of the word line WL and the bit line BL become VKK (=−0.3 V) and VSS (=0.0 V), respectively. The bipolar transistor 22 and the MOS transistor 23 of each of the memory cells MC are off, respectively. The base node BN is floating, and an electric potential of the emitter node EN becomes the same VSS as that of the bit line BL. Electric potentials of the collector and the source are VSS of the ground wiring.

At the write time, an electric potential of VWL (=2.4 V) is given to the selective WL. Accordingly, in the selective cell, the bipolar transistor 22 and the MOS transistor 23 become on, and the emitter node EN is connected to the ground wiring.

When phase-changing the memory element 20 of the selective cell to an amorphous phase, an electric potential of the become VSS because the current Icell does not flow while the selective element 21 becomes on.

At the read time, an electric potential of VWL is also given to the selective WL. Accordingly, in the selective cell, both the bipolar transistor 22 and the MOS transistor 23 become on, and the emitter node EN is connected to the ground wiring.

Thereafter, an electric potential of VRead (about 1.5 V) is given to the selective BL, as shown in FIGS. 7A and 7B. Accordingly, the current Icell flows to the selective cell. Specifically, an electric potential of VRead is determined such that a current value of the current Icell becomes small to an extent that a phase state of the memory element 20 does not change.

An electric potential of the selective BL becomes low when the current Icell flows. When the memory element 20 is in an amorphous phase (a high resistance state), a current value of the current Icell becomes relatively small, and a reduction of the electric potential of the selective BL becomes small. Therefore, as shown in FIG. 7A, a reduction of the current of the selective BL is little observed. On the other hand, when the memory element 20 is in a crystalline phase (a low resistance state), a current value of the current Icell becomes relatively large. Therefore, a reduction of the current of the selective BL is observed as shown in FIG. 7B.

An electric potential of the emitter node EN of the selective cell at the read time becomes about 1.1 V as shown in Table 1. Although electric potentials of the base node BN and the collector of the selective cell become floating because the current Icell flows, these electric potentials become about substantially 0 V because the current Icell at the read time is small as described above.

Regarding the non-selective cell B at the read time, electric potentials are identical to those at the standby time, except that an electric potential of the emitter node EN becomes about 1.5 V that is the same as the electric potential of the bit line and that an electric potential of the base node BN becomes about 0.5 V, as shown in Table 1. On the other hand, regarding the non-selective cell W at the read time, electric potentials of the emitter node EN, the base node BN, and the collector become VSS, respectively because the current Icell does not flow while the selective element 21 becomes on.

The configuration of the semiconductor device 1 is explained next.

As shown in FIG. 1, the semiconductor device 1 has plural word lines WL that are arranged in the X direction and plural bit lines BL that are arranged in the Y direction. Each of the word lines WL is a linear conductor that is extended in the X direction and is constituted by a material such as doped polysilicon, for example. On the other hand, each of the bit lines BL is a linear conductor that is extended in the Y direction and is constituted by a metal material such as copper (Cu), for example.

Although not shown in the drawing, row decoders are provided at both ends of a memory mat in the X direction, and the word lines WL are alternately connected to the row decoders at both ends. Similarly, column decoders are provided at both ends of the memory mat in the Y direction, and the bit lines BL are alternately connected to the column decoders at both ends.

Every third word line WL is a dummy word line DWL. The word lines WL including the dummy word lines DWL are arranged at equal distances. That is, two word lines WL and one dummy word line DWL form a unit configuration. This unit configuration is repeatedly arranged in the Y direction. The dummy word lines DWL are provided because it is desirable to set wiring densities of the word lines WL constant to secure a satisfactory processing condition and to employ an arrangement (to be described later) in which an area occupied per one memory cell MC becomes $6F^2$ (F is a minimum feature size).

The word lines WL (including the dummy word lines DWL) are embedded into the semiconductor substrate 10 as shown in FIGS. 3A and 3B. The insulating film regions 11 (cap insulating film regions) that are extended in the X direction are provided along an upper surface of the word lines WL (its definition is a surface side of the substrate). Silicon nitride or silicon oxide is preferably used for the constituent material of the insulating film regions 11. The insulating film regions 11 are also embedded into the semiconductor substrate 10 as shown in FIGS. 3A and 3B. All bodies of the word lines WL are embedded beneath the surface of the substrate. All side surfaces (an upper surface, both side surfaces, and a lower surface (a bottom surface)) of the word lines WL are included in the substrate. A part of a body of each insulating film region 11 is embedded beneath the surface of the substrate. Both side surfaces and a lower surface of each insulating film region 11 as a part of the body are included in the substrate. An upper surface of the insulating film region 11 is at the same position as a position of the surface of the substrate. In the present application, the insulating film region 11 of which both side surfaces and a lower surface excluding an upper surface are included in the substrate is explained as "the insulating film region 11 embedded in the substrate". This is similarly applied to the element isolation regions 12 described later. The upper surface means a side that is close to a surface side of the substrate. The lower surface means a side that is far from the surface of the substrate. The side surface means a surface perpendicular to the surface of the substrate. These are similarly applied to the following explanations.

The element isolation region 12 (first element isolation region) that is long in the Y direction is provided between the bit lines BL as shown in FIG. 2. The element isolation regions 12 are provided to partition the active region K as a region that forms the memory cell MC. Silicon nitride or silicon oxide is preferably used for the constituent material of the element isolation region 12. From a first viewpoint, each active region K is defined (partitioned) between the element isolation regions 12. The element isolation region 12 is also embedded into the semiconductor substrate 10 as shown in FIGS. 3B and 3C. Both side surfaces and a lower surface of the element isolation region 12 are included in the substrate, and an upper surface is the same as the surface of the substrate.

From a second viewpoint, the active regions K are partitioned by the insulating film regions 11 that are formed along an upper surface of the dummy word lines DWL. Two word lines WL are arranged in one active region K. Two selective elements 21 (first and second selective elements) that uses each of the two word lines WL as its gate electrode, and two memory cells (first and second memory cells) that use these selective elements 21, respectively are formed in one active region K. A configuration within the active region K is explained in detail with reference to FIGS. 3A, 3B, and 3C.

The selective element 21 includes the word line WL (gate electrode) that covers a lower surface 11c of the insulating film region 11, and the gate insulating film 14 (see FIG. 3A) that is provided between the word line WL and the semiconductor substrate 10. The gate insulating film 14 is shown by a thick solid line. The gate insulating film 14 is preferably constituted by providing a trench in the semiconductor substrate 10 to form the word line WL and thereafter by oxidizing an internal wall of the trench. Except in FIG. 3A, reference numeral "14" is not attached to the gate insulating film.

The selective element 21 further includes the first to third diffusion regions 15 to 17. The first diffusion region 15 is an $N^-$-type (N minus type) impurity diffusion region that covers a side surface 11a of the insulating film region 11 in the bit-line direction (a side surface opposite to the other selective element 21 in the active region K), and is provided in contact with the side surface 11a. The second diffusion region 16 is an $N^-$-type impurity diffusion region that covers a side surface 11b of the insulating film region 11 in the bit-line direction (a side surface at an opposite side of the side surface 11a), and is provided in contact with the side surface 11b. The third diffusion region 17 is a $P^+$-type (P plus type) impurity diffusion region that covers an upper surface of the second diffusion region 16, and is provided in contact with the upper surface of the second diffusion region 16.

The first and second diffusion regions 15 and 16 are formed by implanting an N-type (second conductivity type) impurity into the surface of the semiconductor substrate 10. The third diffusion region 17 is formed by implanting an impurity of the same conductivity-type (P-type) as that of the semiconductor substrate 10 on the surface of the second diffusion region 16.

It is preferable that the N-type impurity is simultaneously implanted into the first and second diffusion regions 15 and 16. With this arrangement, the total of the length of the second diffusion region in a Z direction and the length of the third diffusion region 17 in the Z direction becomes substantially the same as the length of the first diffusion region 15 in the Z direction. Conversely, it becomes possible to implant the N-type impurity simultaneously into the first and second diffusion regions 15 and 16 by uniforming the total of the length of the second diffusion region in a Z direction and the length of the third diffusion region 17 in the Z direction with the length of the first diffusion region 15 in the Z direction.

Based on the above configuration, the MOS transistor 23 is formed by the semiconductor substrate 10, the first and second diffusion regions 15 and 16, the gate insulating film 14, and the word line WL. The bipolar transistor 22 is formed by the semiconductor substrate 10 and the second and third diffusion regions 16 and 17.

FIG. 4 is an explanatory diagram of a relationship between a configuration of the semiconductor device 1 shown in FIG. 3 and circuit elements of the semiconductor device 1 shown in FIG. 5. FIG. 4 shows circuit elements such as the bipolar transistors 22 that are superimposed on the cross-sectional view shown in FIG. 3A. As shown in FIG. 4, the first diffusion region 15 constitutes a source of the MOS transistor 23, and the second diffusion region 16 constitutes a drain of the MOS transistor 23 and a base of the bipolar transistor 22. The third diffusion region 17 constitutes an emitter of the bipolar transistor 22, and the semiconductor substrate 10 constitutes a collector of the bipolar transistor 22.

The collector of the bipolar transistor 22 and the source of the MOS transistor 23 are grounded as are also shown in FIG. 4. This grounding is achieved by connecting the semiconductor substrate 10 and the first diffusion region 15 to the ground wiring VSS. Specifically, as shown in FIG. 1, some of the bit lines BL are used for the ground wiring VSS. The semiconductor substrate 10 and the first diffusion regions 15 are connected to the ground wirings VSS by contact conductors 30 and 31, respectively.

Two selective elements 21 are provided in one active region K as described above. As a detailed configuration, the two selective elements 21 share the first diffusion region as shown in FIG. 4. One selective element 21 has a symmetrical structure with the other selective element 21 across the first diffusion region 15. By employing this configuration, in the semiconductor device 1, a distance from the third diffusion region 17 of one selective element 21 to the third diffusion region 17 of the other selective element 21 becomes 5F. Therefore, in the semiconductor device 1, an occupied area per one active region K becomes 6F$^2$.

Lower surfaces of the first and second diffusion regions 15 and 16 are provided at a higher position than that of the upper surface of the word line WL as shown in FIG. 4. That is, the first and second diffusion regions 15 and 16 and the word line WL are not adjacent to each other across the gate insulating film 14. This arrangement is provided to prevent an occurrence of a parasitic transistor. That is, if the word line WL (gate electrode) and the second diffusion region 16 are adjacent to each other across the gate insulating film 14, for example, a MOS transistor (parasitic transistor) is formed which has the word line WL as a control electrode and has the third diffusion region 17 and the semiconductor substrate 10 as non-control electrodes. Formation of this parasitic transistor is not desirable. Therefore, as described above, the lower surfaces of the first and second diffusion regions 15 and 16 are set at a higher position than that of the upper surface of the word line WL, thereby preventing formation of a parasitic transistor, as described above.

Each of the memory elements 20 is formed on an upper surface of the third diffusion region 17 of the corresponding selective element 21. Specifically, a contact conductor 32 is formed on the upper surface of the third diffusion region 17, and a lower electrode UE is formed on an upper surface of the contact conductor 32, as shown in FIGS. 3A and 3C. A phase-change memory element GST made of a phase change material described above is formed on an upper surface of the lower electrode UE. An upper electrode TE that is common to the memory elements 20 arranged in the bit line direction (the Y direction) is formed on an upper surface of the phase-change memory element GST. The memory element 20 is constituted by the lower electrode UE, the phase-change memory element GST, and the upper electrode TE. The upper electrode TE is electrically connected to the bit line BL by a contact conductor 33.

For a material of the lower electrode UE, a material having a relatively high electric resistance such as metal silicide, metal nitride, and a nitride of metal silicide, for example is preferably used. Although not particularly limited, a high melting-point metal such as W, TiN, TaN, WN, and TiAlN, a nitride of these high melting-point metals, a nitride of a high melting-point silicide such as TiSiN, WSiN, and a material such as TiCN can be preferably used. A metal material having a relatively low electric resistance is preferably used for a material of the upper electrode TE. For example, aluminum (Al), titanium (Ti), tungsten (W), an alloy of these metals, and a nitride or silicide of these metals can be preferably used.

As explained above, in the semiconductor device 1 according to the first embodiment, the second and third diffusion regions 16 and 17 are arranged in the normal direction (the Z direction) of the semiconductor substrate 10. Therefore, 3F (F is a minimum feature size) is sufficient for the length of the selective element 21 in the bit line direction (the X direction). Consequently, the length of the selective element 21 in the bit line direction (the X direction) can be shortened as compared with the length according to the conventional technique.

As described above, in the semiconductor device 1 according to the first embodiment, formation of a parasitic transistor attributable to the word line WL and the first and second diffusion regions 15 and 16 being adjacent to each other across the gate insulating film 14 can be prevented.

Further, because a region between the word lines WL is embedded with the P-type semiconductor substrate 10 not with a dielectric, capacitance coupling between the word lines WL can be reduced and coupling noise generated by the capacitance coupling can be reduced.

Figure 8:
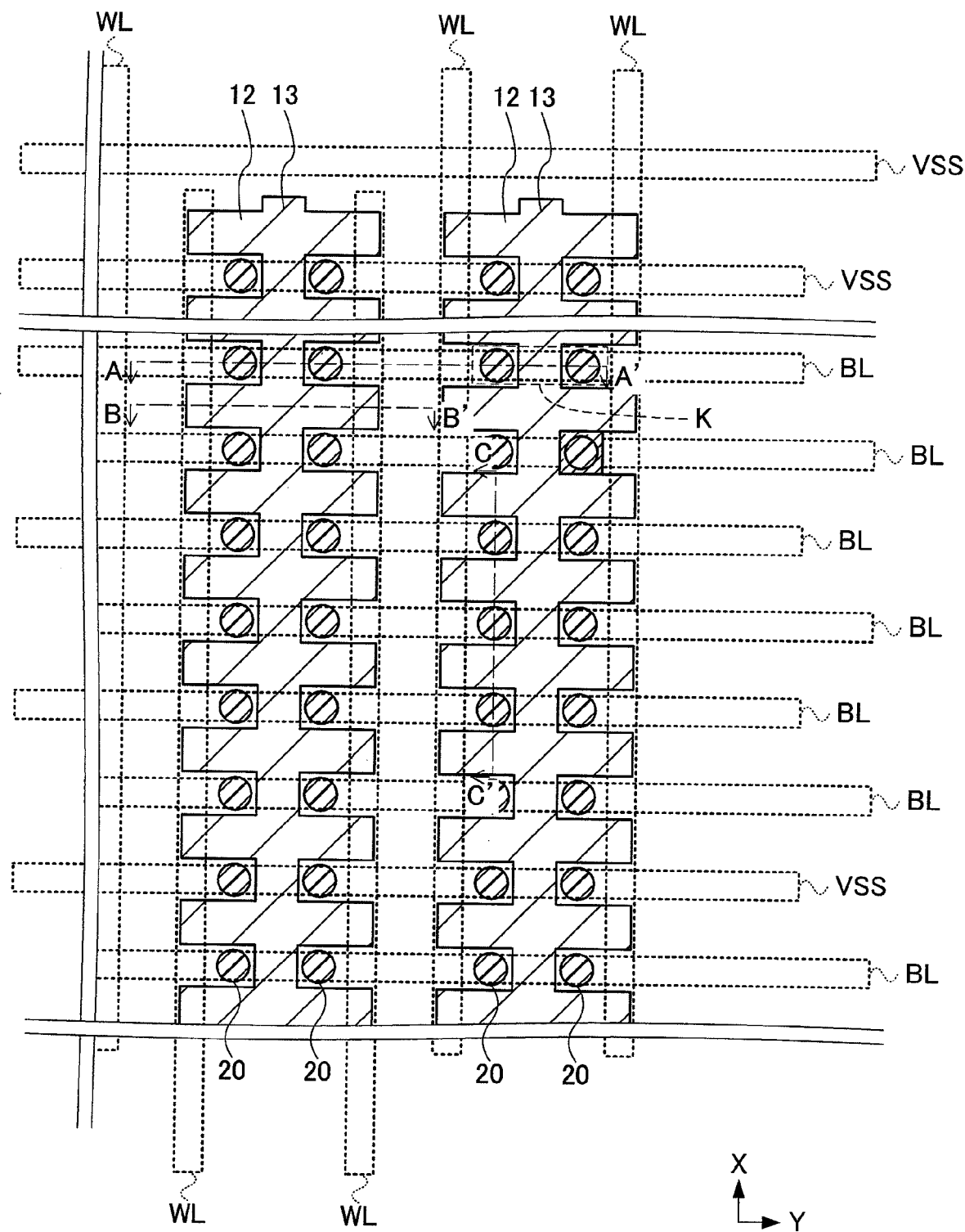
FIG. 8 is a plan view of the semiconductor device according to a second embodiment of the present invention.

FIG. 8 is a plan view of the semiconductor device 1 according to a second embodiment of the present invention. FIG. 8 corresponds to FIG. 2 shown in the first embodiment. FIGS. 9A to 9C are cross-sectional views of the semiconductor device 1 corresponding to a cross section along a line A-A', a cross section along a line B-B', and a cross section along a line C-C' shown in FIG. 8, respectively.

As shown in FIGS. 8 and 9, the semiconductor device 1 according to the second embodiment is different from the semiconductor device 1 according to the first embodiment in that the semiconductor device 1 according to the second embodiment additionally includes element isolation regions 13 (second and third element isolation regions) and excludes the dummy word lines DWL and the insulating film regions 11 on the dummy word lines DWL.

Each of the element isolation regions 13 replaces the dummy word line WL and a portion on the dummy word line DWL in the first embodiment, as shown in FIGS. 8, 9A, and 9B. That is, the element isolation regions 13 are arranged to sandwich two word lines WL.

By providing the element isolation regions 13, the active region K that is identical to that in the first embodiment can be partitioned without using the dummy word lines DWL. Because the dummy word lines DWL are not used, capacitance coupling between the dummy word line DWL and the word line WL can be avoided.

Figure 10:
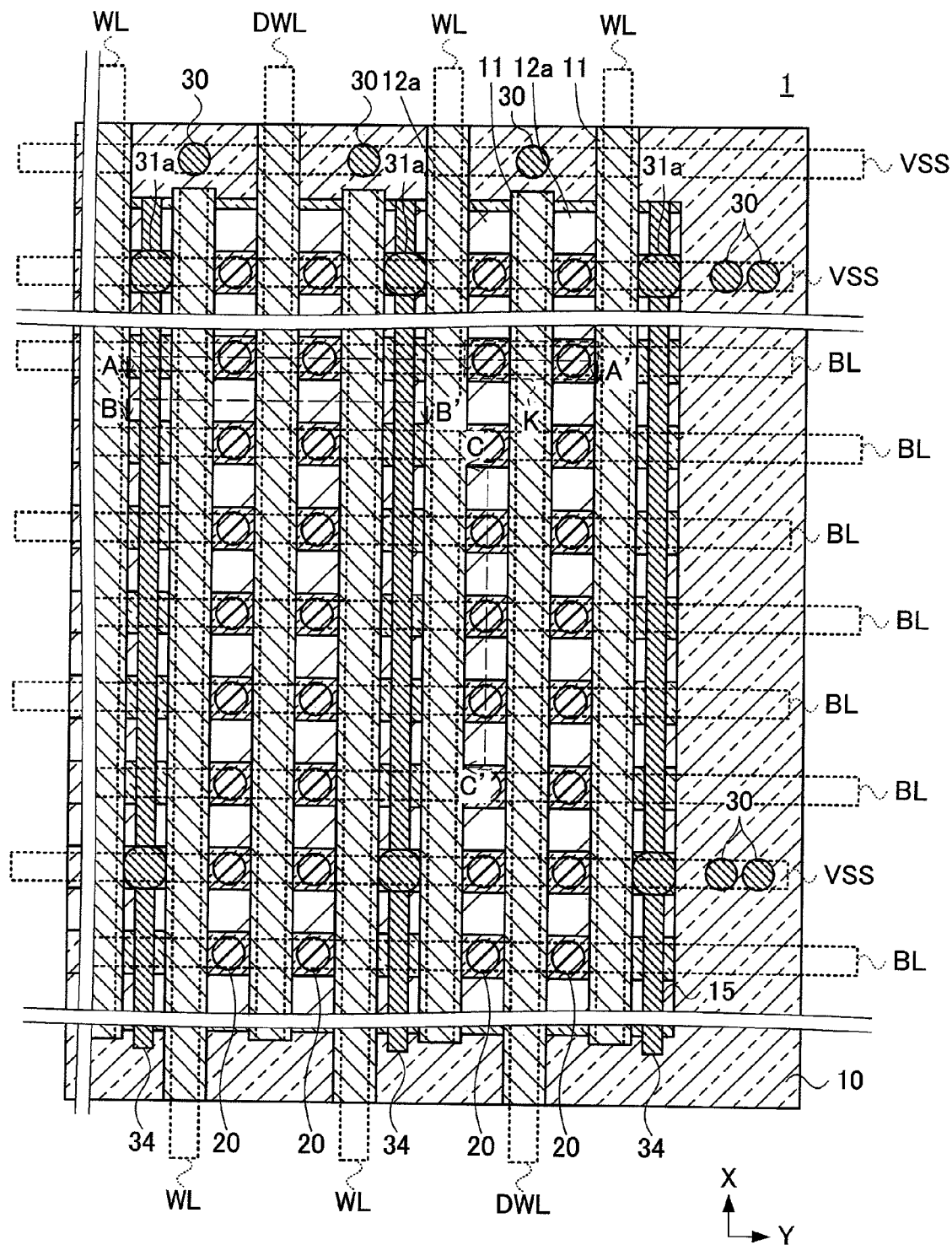
FIGS. 10 and 11 are plan views of the semiconductor device according to a third embodiment of the present invention.
Figure 11:
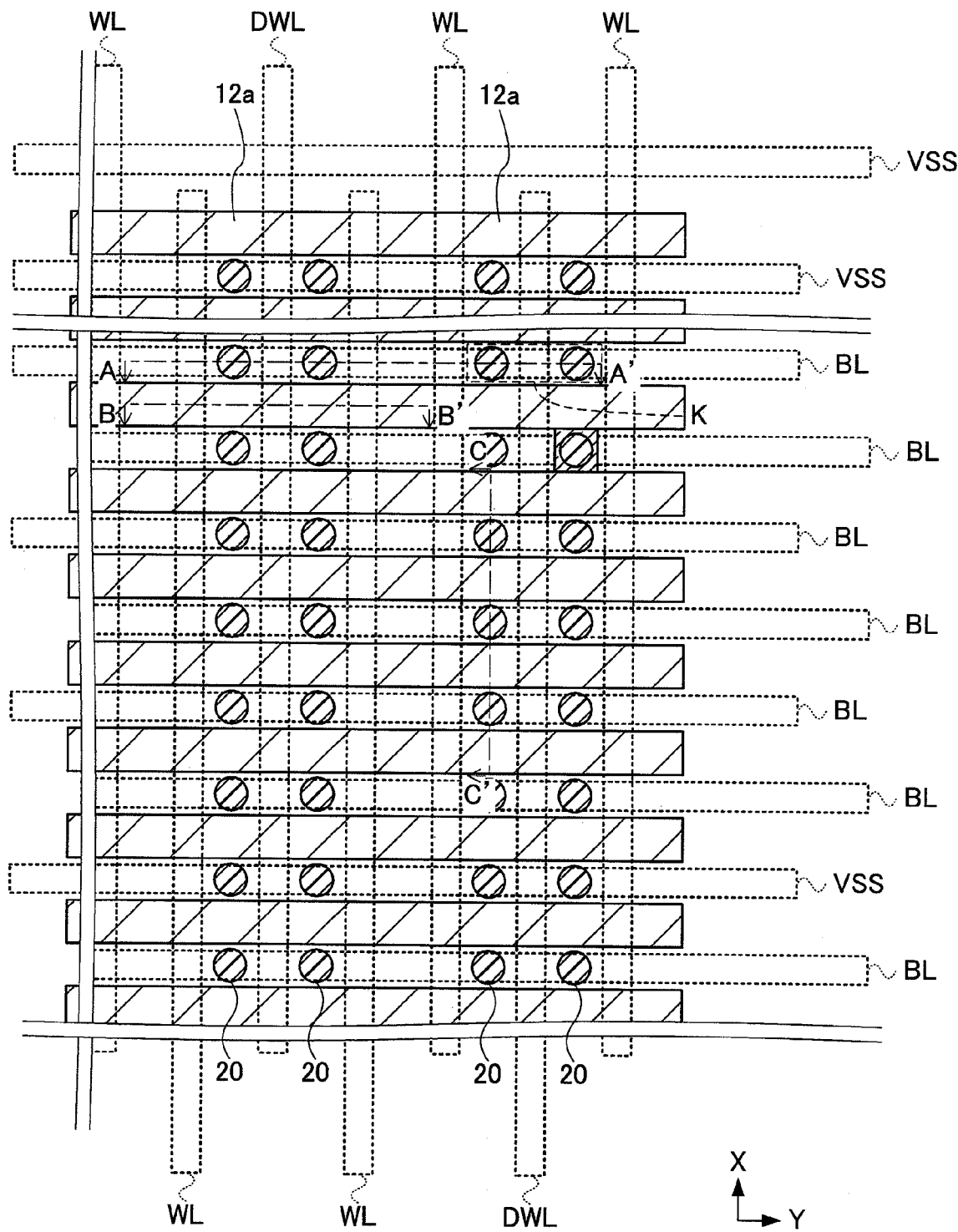
Figure 12A:
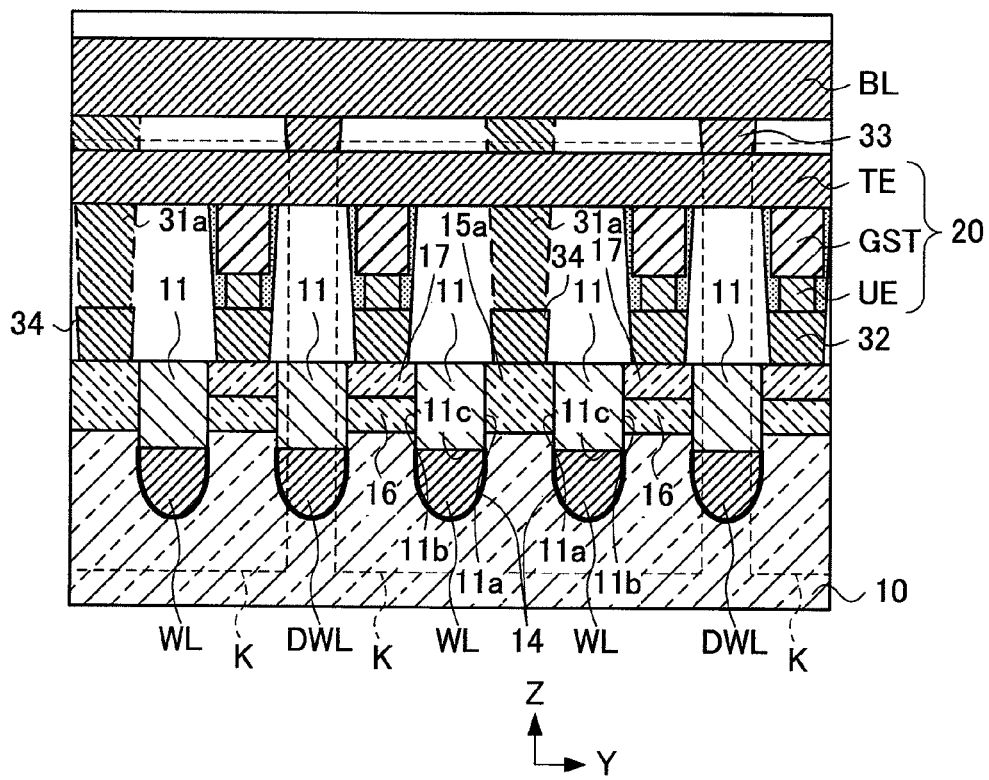
FIGS. 12A to 12C are cross-sectional views of the semiconductor device corresponding to a cross section along a line A-A', a cross section along a line B-B', and a cross section along a line C-C' shown in FIGS. 10 and 11, respectively.
Figures 12B, 12C:
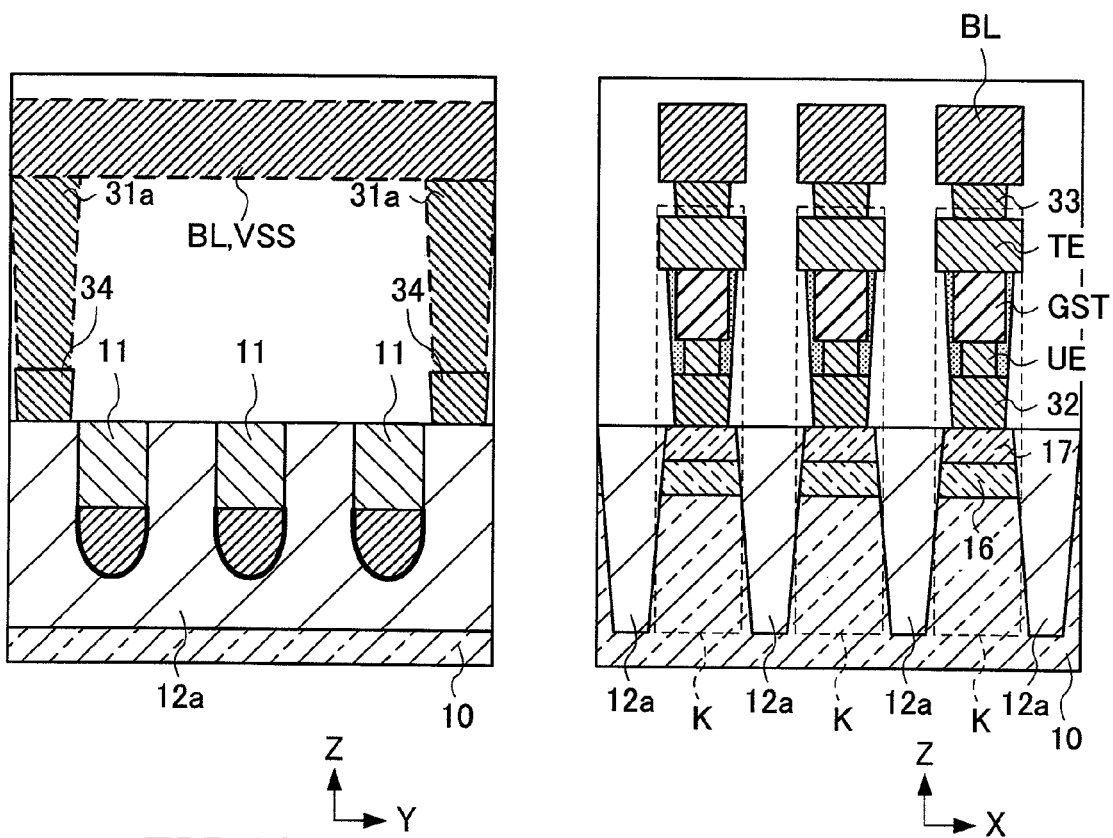

FIGS. 10 and 11 are plan views of the semiconductor device 1 according to a third embodiment of the present invention. FIGS. 10 and 11 correspond to FIGS. 1 and 2 shown in the first embodiment. FIGS. 12A to 12C are cross-sectional views of the semiconductor device 1 corresponding to a cross section along a line A-A', a cross section along a line B-B', and a cross section along a line C-C' shown in FIGS. 10 and 11, respectively.

As shown in FIGS. 10 to 12, the semiconductor device 1 according to the third embodiment is different from the semiconductor device 1 according to the first embodiment in that the element isolation regions 12, the first diffusion regions 15, and the contact conductors 31 are replaced by element isolation regions 12a, first diffusion regions 15a, and contact conductors 31a, respectively, and that slit-shaped contact conductors 34 (hereinafter, simply "contact conductors") are added. Other features of the semiconductor device 1 according to the third embodiment are identical to those of the semiconductor device 1 according to the first embodiment.

The element isolation regions 12a are extended in the Y direction from an end to an end of a memory mat without a break through a lower end of the contact conductors 34. By constituting the element isolation regions 12a in this way, the first diffusion regions 15a are divided by the element isolation regions 12a.

To connect the divided first diffusion regions 15a to the ground wirings VSS, in the third embodiment, the contact conductors 34 for mutually connecting the first diffusion regions 15a arranged in the X direction are formed on the surface of the semiconductor substrate 10, as shown in FIGS. 10, 12A and 12B. Each of the contact conductors 31a connects the contact conductor 34 and the ground wiring VSS.

According to the semiconductor device 1 of the third embodiment, preparation of a mask pattern to be used when forming the element isolation regions 12a becomes easy because the element isolation regions 12a are continuously extended from an end to an end of the memory mat.

Figure 13:
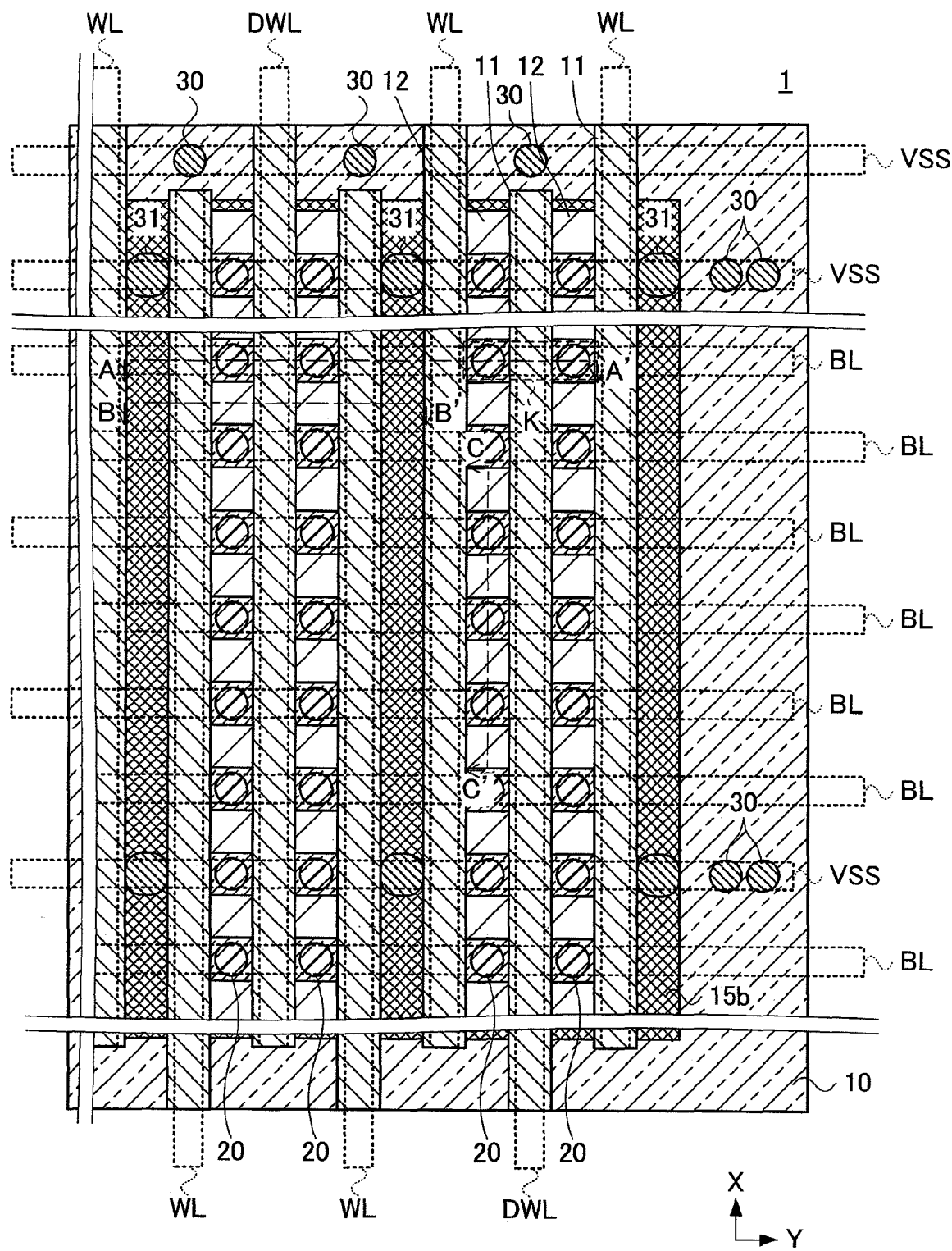
FIG. 13 is a plan view of the semiconductor device according to a fourth embodiment of the present invention.
Figure 14A:
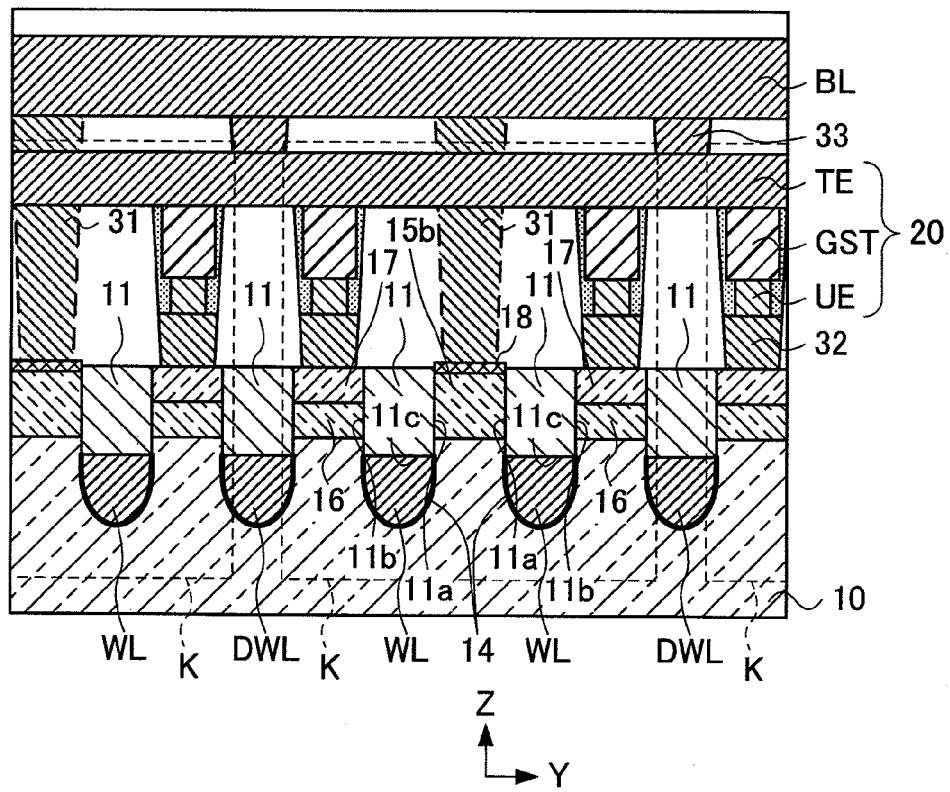
FIGS. 14A to 14C are cross-sectional views of the semiconductor device corresponding to a cross section along a line A-A', a cross section along a line B-B', and a cross section along a line C-C' shown in FIG. 13, respectively.
Figures 14B, 14C:
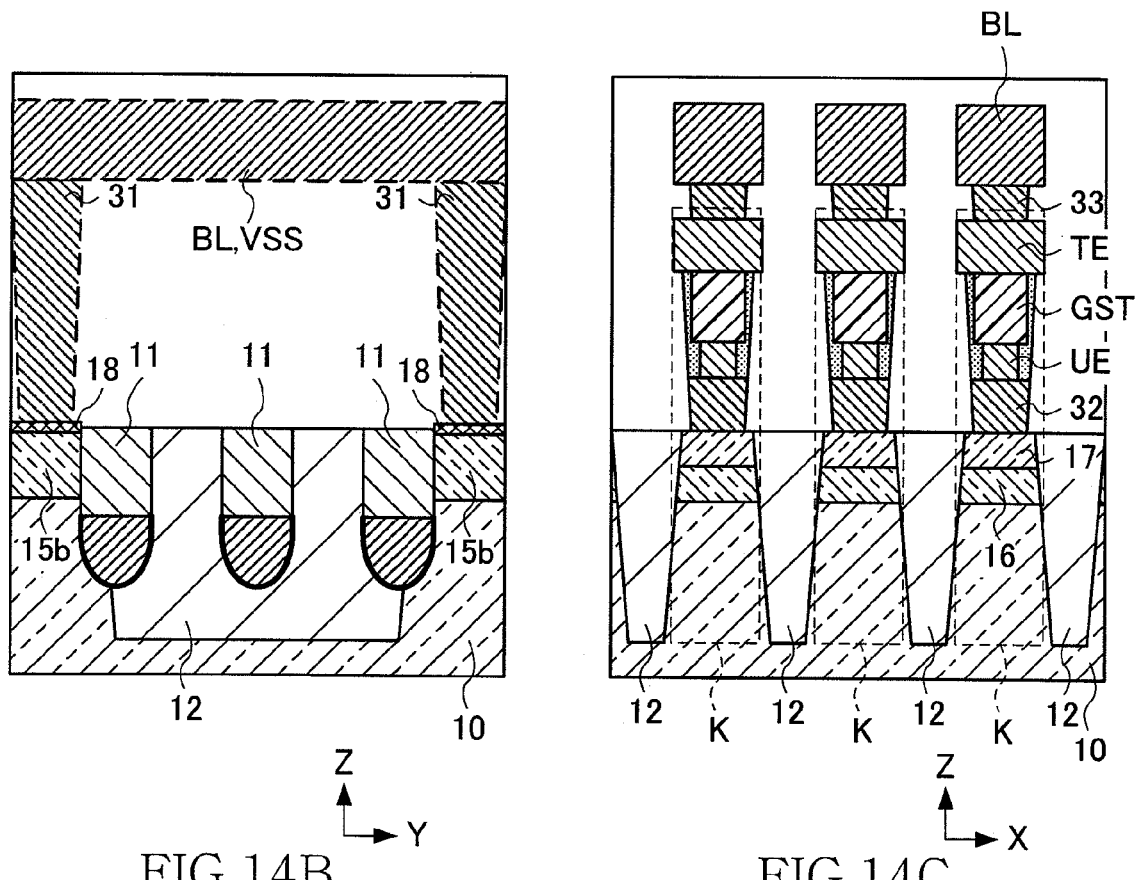

FIG. 13 is a plan view of the semiconductor device 1 according to a fourth embodiment of the present invention. FIG. 13 corresponds to FIG. 1 described in the first embodiment. FIGS. 14A to 14C are cross-sectional views of the semiconductor device 1 corresponding to a cross section along a line A-A', a cross section along a line B-B', and a cross section along a line C-C' shown in FIG. 13, respectively.

As shown in FIGS. 13 and 14, the semiconductor device 1 according to the fourth embodiment is different from the semiconductor device 1 according to the first embodiment in that the first diffusion regions 15 are replaced by the first diffusion regions 15b. Other features of the semiconductor device 1 according to the fourth embodiment are identical to those of the semiconductor device 1 according to the first embodiment.

The first diffusion regions 15b are provided by performing salicide processing on the first diffusion regions 15. The salicide processing is performed by depositing a metal such as Ti and Co by several tens of nanometers by a sputtering method after forming the first diffusion regions 15 by implanting an N-type impurity into the surface of the semiconductor substrate 10, and by forming silicide 18 on the surface of the metal by reacting the metal with silicon by annealing.

By using the first diffusion regions 15b having the salicide processing performed thereon, a contact resistance between the first diffusion region 15b and the contact conductor 31 can be lowered.

It is apparent that the present invention is not limited to the above embodiments, but may be modified and changed without departing from the scope and spirit of the invention.

The technical concept of the present invention can be also applied to, for example, an RE-RAM (Resistance Random Access Memory) in addition to a PC-RAM explained in the above embodiments. Further, the present invention can be also applied to an IGBT and an FET that are related to a memory element that passes a relatively large current to a memory cell. In addition, the type of the memory element is not limited to a nonvolatile memory element.

The technical concept of the present invention can be applied to various types of semiconductor devices. For example, the present invention can be applied to a general semiconductor device such as a CPU (Central Processing Unit), an MCU (Micro Control Unit), a DSP (Digital Signal Processor), an ASIC (Application Specific Integrated Circuit), an ASSP (Application Specific Standard Circuit), and a Memory device. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

Furthermore, although an example in which a selective element has a MOS transistor has been explained in the above embodiments, the present invention is not limited thereto as long as the transistor is a field-effect transistor (FET). That is, other than a MOS (Metal Oxide Semiconductor), the present invention can be also applied to various types of FETs such as a MIS (Metal-Insulator Semiconductor) and a TFT (Thin Film Transistor).

In the above embodiments, although P-type and N-type have been explained as the first conductivity type and the second conductivity type, respectively, this relationship can be opposite. That is, N-type and P-type can be the first conductivity type and the second conductivity type, respectively. In this case, an N-type semiconductor substrate is used for the semiconductor substrate 10, and the first to third diffusion regions 15 to 17 become P-type, P-type, and N-type, respectively. Therefore, the bipolar transistors 22 become NPN type, and the MOS transistors 23 become P-channel type.

Many combinations and selections of various constituent elements disclosed in this specification can be made within the scope of the appended claims of the present invention. That is, it is needles to mention that the present invention embraces various changes and modifications which can be made by those skilled in the art based on the entire disclosure of this specification including the claims and the technical concept of the invention.

In addition, while not specifically claimed in the claim section, the applicant reserves the right to include in the claim section of the application at any appropriate time the following devices:

A1. A semiconductor device comprising:
a semiconductor substrate of a first conductivity type including a trench that extends to a first direction, the trench having a bottom surface and an inner wall;

a gate insulating film that is formed on the bottom surface and a part of the inner wall of the trench;

a gate electrode that is embedded in a lower portion of the trenches so as to cover the gate insulating film, the gate electrode being served as a word line extending to the first direction;

a cap insulating film that is embedded in an upper portion of the trenches so as to cover the gate electrode and extending to the first direction;

a plurality of first diffusion regions of a second conductivity type opposite to the first conductivity type that are formed in the semiconductor substrate and each located on a part of a first side surface of the first cap insulating film;

a plurality of second diffusion regions of the second conductivity type that are formed in the semiconductor substrate and each located on a part of a second side surface of the first cap insulating film;

a plurality of third diffusion regions of the first conductivity type that is formed in the semiconductor substrate each located on another part of the second side surface of the first cap insulating film and each located between an upper surface of the semiconductor substrate and an associated of upper surfaces of the second diffusion regions;

a plurality of bit lines extending to a second direction opposite to the first direction;

a plurality of active regions formed in the semiconductor substrate each formed below an associated one of bit lines, the active regions being partitioned by a first element isolation region formed between a region below the bit lines; and a plurality of memory elements that correspond respectively to one of intersections of the bit lines and the word lines, each of the memory elements being connected to an associated one of the third diffusion regions and formed in the active regions, wherein corresponding ones of the first and second diffusion regions and the first gate electrode constitute a field-effect transistor, corresponding ones the second and third diffusion regions and the semiconductor substrate constitute a bipolar transistor, the first and second side surfaces are opposite to each other in the second direction, the field-effect transistors and the bipolar transistors that respectively correspond to the field-effect transistors constitute a plurality of selective elements, and the memory elements and the selective elements that respectively correspond to the memory elements constitute a plurality of memory cells.

A2. The semiconductor device in A1, wherein the memory cells include first and second memory cells that share the first diffusion region, have mutually symmetrical structures using the first diffusion region as an axis, and are adjacent to each other in the second direction.

A3. The semiconductor device in A2, wherein a plurality of the word lines are provided, the word lines are arranged at an equal interval in the second direction, the word lines have two of the word lines related to the first and second memory cells as a group, and the word lines further include dummy word lines that are arranged between two of the groups and do not make field-effect transistors constituted by the dummy word lines conductive.

A4. The semiconductor device in A3, wherein the active regions are further partitioned by two of the dummy word lines.

A5. The semiconductor device in A3 or A4, wherein the two groups adjacent in the second direction have mutually symmetrical structures using the dummy word line as an axis.

A6. The semiconductor device according to any one of A1 to A5, wherein the active regions are also divided by the first element isolation regions in the second direction so as to define the first and second memory cells.

A7. The semiconductor device in A2, further comprising:

a second element isolation region that is extended in the first direction, the first memory cell being sandwiched between the second element isolation region and the word line related to the first memory cell; and a third element isolation region that is extended in the first direction, the second memory cell being sandwiched between the third element isolation region and the word line related to the second memory cell, wherein the active region is further defined by the second and third element isolation regions from a viewpoint of the second direction, and the first and second memory cells are included in the further defined active region.

A8. The semiconductor device according to any one of A1 to A7 wherein an upper surface of the word line is located at a position lower than lower surfaces of the first and second diffusion regions.

A9. The semiconductor device according to any one of A1 to A8, wherein a sum of lengths of the second and third diffusion regions in a third direction that is perpendicular to the first and second directions is substantially same as a length of the first diffusion region in the third direction.

A10. The semiconductor device according to any one of A1 to A9, wherein each of the memory elements includes a phase-change memory element.

A11. The semiconductor device according to any one of A1 to A10, wherein an electric potential that brings the bipolar transistor into conductive is supplied to the first diffusion region by turning the first field-effect transistor on.

A12. The semiconductor device according to any one of A1 to A11, further comprising a slit-shaped contact conductor that is extended in the first direction and is formed above a plurality of the first diffusion regions, and is connected to the first diffusion regions.

A13. The semiconductor device in A12, wherein the first element isolation region is extended in the second direction below the slit-shaped contact conductor and crosses the slit-shaped contact conductor.

A14. The semiconductor device in A12 or A13, wherein the first element isolation region is one of the plurality of the first diffusion regions corresponding to the plural active regions formed respectively in the second direction.

A15. The semiconductor device according to any one of A1 to A14, wherein the first diffusion region includes a salicide structure.

What is claimed is:

1. A semiconductor device comprising:
a semiconductor substrate of a first conductivity type including a trench having a bottom surface and an inner wall;
a gate insulating film that is formed on the bottom surface and a part of the inner wall of the trench;
a first gate electrode that is embedded in a lower portion of the trench so as to cover the gate insulating film;
a first cap insulating film that is embedded in an upper portion of the trench so as to cover the first gate electrode;

a first diffusion region that is formed in the semiconductor substrate and located on a first side surface of the first cap insulating film;
a second diffusion region that is formed in the semiconductor substrate and located on a second side surface of the first cap insulating film opposite to the first side surface; and
a third diffusion region that is formed in the semiconductor substrate located on the second side surface of the first cap insulating film and located between an upper surface of the semiconductor substrate and an upper surface of the second diffusion region, wherein
the first and second diffusion regions and the first gate electrode constitute a first field-effect transistor,
the second and third diffusion regions and the semiconductor substrate constitute a first bipolar transistor,
the first field-effect transistor and the first bipolar transistor constitute a first selective element,
the first and second diffusion regions have a second conductivity type opposite to the first conductivity type, and
the third diffusion region has the first conductivity type.

2. The semiconductor device as claimed in claim 1, wherein an upper surface of the first gate electrode is located at a position lower than lower surfaces of the first and second diffusion regions.

3. The semiconductor device as claimed in claim 1, wherein a sum of lengths of the second and third diffusion regions in a perpendicular direction that is perpendicular to the upper surface of the semiconductor substrate is substantially same as a length of the first diffusion region in the perpendicular direction.

4. The semiconductor device as claimed in claim 1, further comprising a second cap insulating film,
wherein the second and third diffusion regions are sandwiched between the first and second cap insulating films.

5. The semiconductor device as claimed in claim 4, further comprising a second gate electrode that is covered with a lower surface of the second cap insulating film.

6. The semiconductor device as claimed in claim 5, further comprising a fourth diffusion region, wherein
the second cap insulating film is sandwiched between the second and fourth diffusion regions, and
the second gate electrode is supplied with an electric potential so as not to cause the second diffusion region and the fourth diffusion region being electrically conductive.

7. The semiconductor device as claimed in claim 1, further comprising a memory element that is electrically connected to the third diffusion region.

8. The semiconductor device as claimed in claim 7, wherein the memory element includes a phase-change memory element.

9. The semiconductor device as claimed in claim 1, wherein an electric potential that brings the first bipolar transistor into conductive is supplied to the first diffusion region by turning the first field-effect transistor on.

10. The semiconductor device as claimed in claim 9, further comprising a memory element that is electrically connected to the third diffusion region, wherein
an electric potential at which electrons are passed to the memory element is supplied to the semiconductor substrate by turning the first bipolar transistor on.

11. The semiconductor device as claimed in claim 1, further comprising a second selective element that shares the first diffusion region and is constituted by a second field-effect transistor and a second bipolar transistor each having a structure symmetrical with the first selective element using the first diffusion region as an axis.

12. A semiconductor device comprising:
a semiconductor substrate of a first conductivity type;
a cap insulating film that is embedded in the semiconductor substrate and has a first side surface perpendicular to an upper surface of the semiconductor substrate, a second side surface opposite to the first side surface, and a lower surface opposite to the upper surface of the semiconductor substrate;
a first gate electrode of which whole of a body thereof is embedded in the semiconductor substrate and that is covered with a lower surface of the cap insulating film;
a gate insulating film of which whole of a body thereof is embedded in the semiconductor substrate and that is formed between the gate electrode and the semiconductor substrate;
a first diffusion region that covers the first side surface of the cap insulating film;
a second diffusion region that covers the second side surface of the cap insulating film; and
a first selective element that covers the second side surface of the cap insulating film and an upper surface of the second diffusion region, and has a third diffusion region in contact with the upper surface of the semiconductor substrate, wherein
the gate electrode and the first and second diffusion regions constitute a first field-effect transistor,
the semiconductor substrate and the second and third diffusion regions constitute a first bipolar transistor,
the field-effect transistor and the first bipolar transistor constitute the first selective element,
the first and second diffusion regions have a second conductivity type opposite to the first conductivity type, and
the third diffusion region has the first conductivity type.

13. The semiconductor device as claimed in claim 12, wherein an upper surface of the first gate electrode is located at a position lower than lower surfaces of the first and second diffusion regions.

14. The semiconductor device as claimed in claim 12, wherein a sum of lengths of the second and third diffusion regions in a perpendicular direction that is perpendicular to the upper surface of the semiconductor substrate is substantially same as a length of the first diffusion region in the perpendicular direction.

15. The semiconductor device as claimed in claim 12, further comprising a second cap insulating film,
wherein the second and third diffusion regions are sandwiched between the first and second cap insulating films.

16. The semiconductor device as claimed in claim 15, further comprising a second gate electrode that is covered with a lower surface of the second cap insulating film.

17. The semiconductor device as claimed in claim 16, further comprising a fourth diffusion region, wherein
the second cap insulating film is sandwiched between the second and fourth diffusion regions, and
the second gate electrode is supplied with an electric potential so as not to cause the second diffusion region and the fourth diffusion region being electrically conductive.

18. The semiconductor device as claimed in claim 12, further comprising a memory element that is electrically connected to the third diffusion region.

19. The semiconductor device as claimed in claim 18, wherein the memory element includes a phase-change memory element.

20. The semiconductor device as claimed in claim 12, wherein an electric potential that brings the first bipolar transistor into conductive is supplied to the first diffusion region by turning the first field-effect transistor on.

21. The semiconductor device as claimed in claim 20 further comprising a memory element that is electrically connected to the third diffusion region, wherein an electric potential at which electrons are passed to the memory element is supplied to the semiconductor substrate by turning the first bipolar transistor on.

22. The semiconductor device as claimed in claim 12, further comprising a second selective element that shares the first diffusion region and is constituted by a second field-effect transistor and a second bipolar transistor each having a structure symmetrical with the first selective element using the first diffusion region as an axis.

* * * * *